US012744092B2

(12) United States Patent
Khayat et al.

(10) Patent No.: US 12,744,092 B2
(45) Date of Patent: Sep. 22, 2026

(54) MEMORY CELL READ THRESHOLD VOLTAGE OPTIMIZATION

(71) Applicant: MICRON TECHNOLOGY, INC., Boise, ID (US)

(72) Inventors: Patrick R. Khayat, San Diego, CA (US); Sivagnanam Parthasarathy, Carlsbad, CA (US); Mariano Burich, San Diego, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 98 days.

(21) Appl. No.: 18/964,788

(22) Filed: Dec. 2, 2024

(65) Prior Publication Data

US 2026/0155191 A1 Jun. 4, 2026

(51) Int. Cl.
*G11C 16/34* (2006.01)
*G11C 16/26* (2006.01)
*G11C 29/52* (2006.01)

(52) U.S. Cl.
CPC .......... *G11C 16/3404* (2013.01); *G11C 16/26* (2013.01); *G11C 29/52* (2013.01)

(58) Field of Classification Search
CPC ...... G11C 16/3404; G11C 16/26; G11C 29/52
USPC .................................................... 365/185.09
See application file for complete search history.

(56) References Cited

U.S. PATENT DOCUMENTS 6,888,897 B1 * 5/2005 Nazari .................... H04L 1/005 714/752
10,614,853 B2 * 4/2020 Kishino ............. G11B 27/3027

* cited by examiner

*Primary Examiner* — Fernando Hidalgo
(74) *Attorney, Agent, or Firm* — Tarolli, Sundheim, Covell & Tummino LLP

(57) ABSTRACT

A method for determining an optimal read voltage for reading a set of memory cells is described. Read voltages having different amplitudes are provided to each of the memory cells. An output of each of the memory cells is read in response to each of the read voltages. An approximate amplitude of a threshold voltage of each of the memory cells is determined based on the outputs of the respective memory cells in response to the read voltages to generate codewords. Each of the codewords can be associated with a respective one of the read voltages. A decoding process is implemented on each of the codewords to determine a value of each of the codewords. The optimal read voltage is determined based on one of the codewords associated with a respective one or more of the read voltages having a lowest value of the syndrome weight.

20 Claims, 12 Drawing Sheets

| | | R7 READ STROBE | | | | |
|---|---|---|---|---|---|---|
| | | -2Δ | -Δ | $V_{R7}$ | +Δ | +2Δ |
| R3 READ STROBE | -2Δ | 1794 | 1812 | 1828 | 1836 | 1784 |
| | -Δ | 1520 | 1492 | 1564 | 1702 | 1754 |
| | $V_{R3}$ | 1068 | 910 | 1084 | 1436 | 1726 |
| | +Δ | 844 | 634 | 848 | 1342 | 1688 |
| | +2Δ | 984 | 778 | 984 | 1370 | 1676 |

804

| | | R7 READ STROBE | | | | |
|---|---|---|---|---|---|---|
| | | -2Δ | -Δ | $V_{R7}$ | +Δ | +2Δ |
| R3 READ STROBE | -2Δ | 1794 | 1812 | 1828 | 1836 | 1784 |
| | -Δ | 1520 | 1492 | 1564 | 1702 | 1754 |
| | $V_{R3}$ | 1068 | 910 | 1084 | 1436 | 1726 |
| | +Δ | 844 | 634 | 848 | 1342 | 1688 |
| | +2Δ | 984 | 778 | 984 | 1370 | 1676 |

MEMORY CELL READ THRESHOLD VOLTAGE OPTIMIZATION

TECHNICAL FIELD

This disclosure relates to memory devices, and particularly to memory cell read threshold voltage optimization.

BACKGROUND

Memory devices are widely used to store information in various electronic devices. A memory device includes memory cells. A memory cell is an electronic circuit capable of being programmed to a data state of two or more data states. For example, a memory cell may be programmed to a data state that represents a single binary value, often denoted by a binary "1" or a binary "0." As another example, a memory cell may be programmed to a data state that represents a fractional value (e.g., 0.5, 1.5, or the like). To store information, the electronic device may write to, or program, a set of memory cells. To access the stored information, the electronic device may read, or sense, the stored state from the set of memory cells based on providing a read voltage relative to a threshold voltage for the memory cell. However, over time or in response to multiple accesses of memory cells (reading data from and/or writing data to the memory cells), the threshold voltages of memory cells can drift, resulting in potential bit errors in the stored data.

DETAILED DESCRIPTION

Figure 1A:
FIG. 1A illustrates a system for decoding data from a memory sub-system.
Figure 1A:
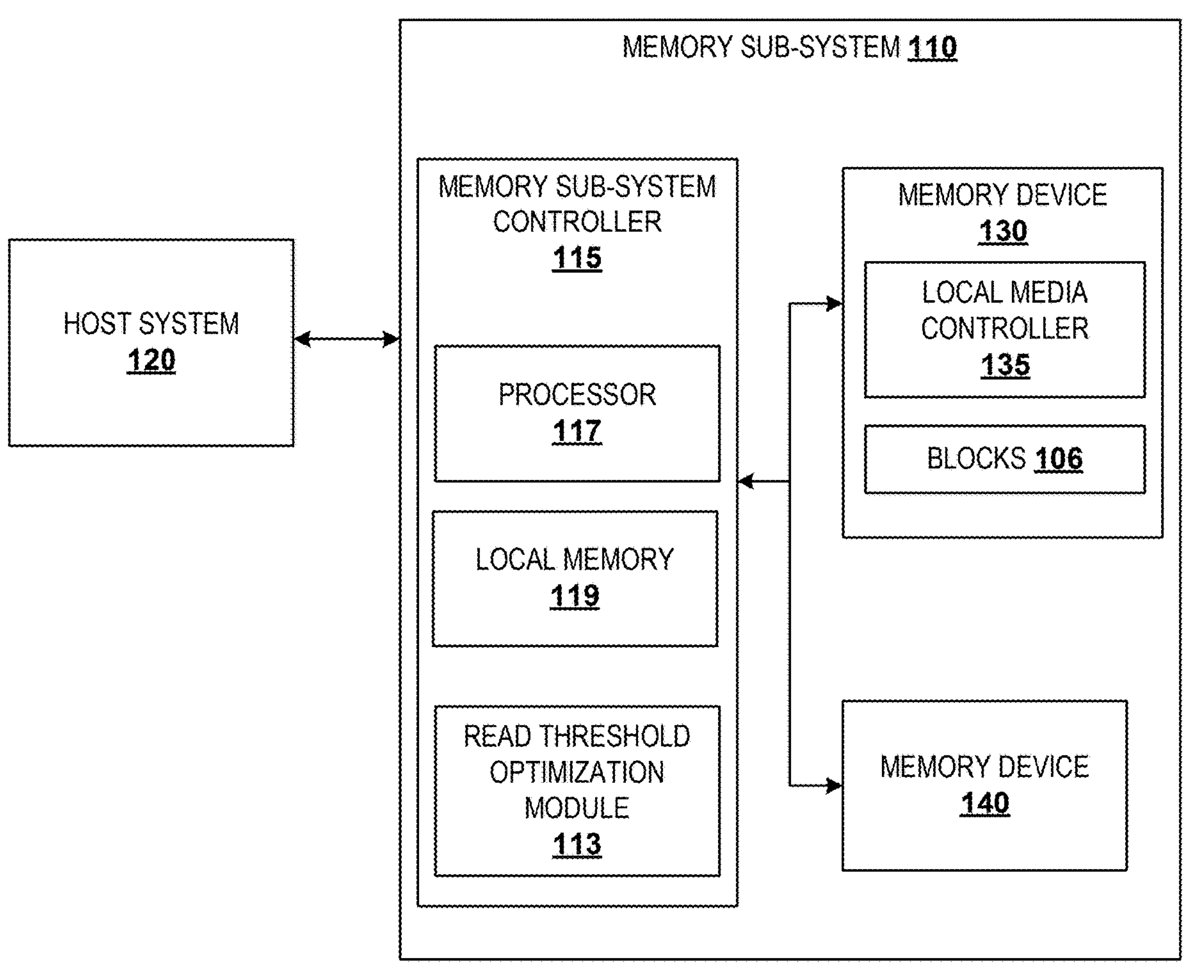

This disclosure relates to memory devices, and particularly to memory cell read threshold voltage optimization.

The system and method described herein can be implemented to optimize an amplitude of a read threshold voltage (also described herein as "read voltage") that is provided to one or more memory cells (e.g., in a NAND memory device) to read data from the memory cells. As described herein, the read voltage that is provided to a set of one or more memory cells (e.g., in a row of a memory array) can be optimized based on implementing a decoding technique to determine a syndrome weight (e.g., a quantity of parity violations) associated with different amplitudes of a provided read voltage. The optimized read voltage can thus correspond to an amplitude of the applied read voltage that results in the lowest syndrome weight (e.g., fewest parity violations) from the decoding process, or to an amplitude that is interpolated based on different values of syndrome weights.

A read voltage can have a nominal amplitude that is between expected amplitudes of a threshold voltage corresponding to different logic states for activating or not activating the memory cell in response to the read voltage. For example, if the read voltage is greater than the threshold voltage, the memory cell can provide an output that is logic-high to indicate a first logic state. Similarly, if the read voltage is less than the threshold voltage, the memory cell can provide an output that is logic-low to indicate a second logic state. The activation of the memory cell to provide an output or not based on the relative amplitudes of the threshold voltage and the applied read voltage can thus be indicative of the logic state of the data stored in the memory cell.

While the threshold voltage of a memory cell or set of memory cells can be approximated and/or initially predictable, the threshold voltage of memory cells can drift in amplitude from a variety of stress factors. Stress factors can include temperature variations, charge loss from long duration data storage, repeated access (write and/or read operations) to the memory cells, and/or other conditions that can affect the amplitude of the threshold voltage. While the threshold voltage of the memory cells drifts, the read voltage applied for reading can be stable and precise, thereby providing an unpredictable disparity in amplitudes between the threshold voltage and the read voltage. As a result, threshold voltage drift can result in bit errors in reading the data from the memory device.

To mitigate the bit errors in reading data from the memory cells resulting from threshold voltage drift, the read voltage that is applied to the memory device can be optimized to an amplitude that provides for more consistent read results relative to the data that is written into the memory device. As described above, the read voltage can have a nominal amplitude that is between expected amplitudes of the threshold voltage for each of different logic states of the data stored in the respective memory cell. This amplitude location is typically referred to as a "valley" based on the slope of the relative populations of bits of the different logic states between which the read voltage is provided, with such population curves being referred to as "levels".

Some read optimization techniques are designed to optimize the read voltage to be approximately equal to the amplitude at the bottom of the valley between the two logic state levels. However, the stress factors described above can affect the slope of the logic state levels relative to each other. Therefore, the bottom of a valley may not be the most optimal amplitude for the read voltage, as opposed to an intersection of the logic state levels (as defined by the data written to the memory device). As a result, such conventional read voltage optimization techniques may not be sufficient to optimize the read voltage to an amplitude that mitigates bit errors when reading the data from the memory cells.

As described herein, the read voltage optimization methodology provides multiple read voltages to determine an approximate amplitude of the threshold voltage of the memory cells. The determination of the approximate amplitude can be based on determining a threshold voltage bin identifier based on the output provided from the memory cell in response to the multiple read voltages. For example, the memory cells can be multi-level (e.g., tri-level) memory cells, to which multiple read strobes are provided to determine the multi-bit data stored in each of the memory cells. The threshold voltage bin identifier can thus distinguish the amplitude of the threshold voltage of different logic transitions between different levels of the memory cells. Therefore, as described herein, the multiple read strobes can be provided in different combinations to read the data from the memory cells.

The outputs provided from a subset of less than all combinations of read strobe voltages can collectively form a respective codeword for each of the combinations. The codewords of the different combinations of read voltages provided to the memory cells can correspond to first codewords that have a quantity of less than a total quantity of different combinations of the read strobe voltages. Upon generating the first codewords, different codewords of different combinations of the read strobe voltages that are not provided to the memory cells can be digitally created as second codewords based on the threshold voltage bin identifier of the bits of each of the first codewords. In this manner, the read threshold optimization can mitigate processing overhead by not reading the memory cells with every combination of read strobe voltages.

The first and second codewords are thus provided to a decoder device to implement a syndrome weight determination procedure (e.g., part of a decoding procedure, such as low-density parity check (LDPC) decoding) on each of the codewords. The syndrome weight determination procedure can thus determine a parity violation count for each of the codewords corresponding to a respective syndrome weight. Given that each of the syndrome weights is associated with a given combination of the read strobe voltages, the lowest syndrome weight can thus correspond to an approximate optimized read voltage. As an example, read strobe voltages associated with the lowest syndrome weight can be implemented as the optimized read voltage. As another example, the optimized read voltage can be interpolated from the lowest syndrome weight and proximal syndrome weights. Accordingly, by optimizing the read voltage based on determining syndrome weights, the read voltage can be optimized more accurately than algorithms that optimize the read voltage based on determining a valley bottom.

FIG. 1A illustrates a system 100 that includes a memory sub-system 110 that can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card and a hard disk drive (HDD). Examples of memory modules include a dual in-line memory module (DIMM), a small outline DIMM (SO-DIMM) and various types of non-volatile dual in-line memory modules (NVDIMMs).

The system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment or a networked commercial device) or such computing device that includes memory and a processing device. The system 100 can include a host system 120 that is coupled to one or more memory sub-systems 110. In some examples, the host system 120 is coupled to different types of the memory sub-system 110. FIG. 1A illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller, CXL controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a compute express link (CXL) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access the memory components (e.g., memory device(s) 130) when the memory sub-system 110 is coupled with the host system 120 by the physical host interface (e.g., PCIe or CXL bus). The physical host interface can provide an interface for passing control, address, data and other signals between the memory sub-system 110 and the host system 120. FIG. 1A illustrates a memory sub-system 110 as an example. In general, the host system 120 can access multiple memory sub-systems via a same communication connection, multiple separate communication connections and/or a combination of communication connections.

The memory device 130 and the memory device 140 are implemented as non-transitory computer readable media. The memory device 130 and the memory device 140 can include any combination of the different types of non-volatile memory devices and/or volatile memory devices. The volatile memory devices (e.g., the memory device 140) can be, but are not limited to, random access memory (RAM), such as dynamic random access memory (DRAM) and synchronous dynamic random access memory (SDRAM).

Some examples of non-volatile memory devices (e.g., memory device(s) 130) include negative-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory device(s) 130 include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) or higher, can store multiple bits per cell. In some examples, each of the memory device(s) 130 can include one or more arrays of memory cells such as SLCs, MLCs, TLCs, QLCs, PLCs, or some combination thereof. In some examples, a particular memory device can include an SLC portion, an MLC portion, a TLC portion, QLC portion, and/or a PLC portion of memory cells. The memory cells of the memory device(s) 130 can be grouped as pages that can refer to a logical unit of the memory device used to store data. In some types of memory (e.g., NAND), pages can be grouped to form blocks. The blocks can include sub-blocks, and can be organized across a set of planes of the memory device 130.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide-based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, electrically erasable programmable read-only memory (EEPROM), etc.

A memory sub-system controller 115 (or controller 115 for simplicity) communicates with the memory device(s) 130 to perform operations such as reading data, writing data or erasing data at the memory device(s) 130 and other such operations. The memory sub-system controller 115 can include hardware such as one or more integrated circuits and/or discrete components, a buffer memory or some combination thereof. The hardware can include a digital circuitry with dedicated (e.g., hard-coded) logic to perform the operations described herein. The memory sub-system controller 115 can be a microcontroller, special purpose logic circuitry (e.g., a field programmable gate array (FPGA), an application specific integrated circuit (ASIC), etc.) or another suitable processor.

The memory sub-system controller 115 can include a processing device, which includes one or more processors (e.g., the processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120. The local memory 119 is a non-transitory computer-readable medium.

In some examples, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another example, a memory sub-system 110 does not include a memory sub-system controller 115 and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device(s) 130. The memory sub-system controller 115 can be responsible for other operations such as wear leveling operations, garbage collection operations, error detection and error-correcting code (ECC) operations, encryption operations, caching operations and address translations between a logical address (e.g., a logical block address (LBA), namespace) and a physical address (e.g., physical block address) that are associated with the memory device(s) 130. The memory sub-system controller 115, for example, may employ a Flash Translation Layer (FTL) to translate logical addresses to corresponding physical memory addresses, which can be stored in one or more FTL mapping tables. In some instances, the FTL mapping table can be referred to as a logical-to-physical (L2P) mapping table storing L2P mapping information. The memory sub-system controller 115 can further include host interface circuitry to communicate with the host system 120 via the physical host interface. The host interface circuitry can convert the commands received from the host system into command instructions to access the memory device(s) 130 as well as convert responses associated with the memory device(s) 130 into information for the host system 120.

The memory sub-system 110 can also include additional circuitry or components that are not illustrated. For example, the memory sub-system 110 can include a cache or buffer (e.g., DRAM) and address circuitry (e.g., a row decoder and a column decoder) that can receive an address from the memory sub-system controller 115 and decode the address to access the memory device(s) 130.

In some examples, the memory device(s) 130 include local media controllers 135 that operate in concert with the memory sub-system controller 115 to execute operations on one or more memory cells of the memory device(s) 130. An external controller (e.g., the memory sub-system controller 115) can externally manage the memory device 130 (e.g., perform media management operations on the memory device 130). In some examples, the memory sub-system 110 is a managed memory device, which is a raw memory device 130 having control logic (e.g., local media controller 135) on the die and a controller (e.g., the memory sub-system controller 115) for media management within the same memory device package. An example of a managed memory device is a managed NAND (MNAND) device.

In operation, the host system 120 manages and controls the flow of data between itself and the memory sub-system 110, ensuring efficient data storage and retrieval operations. More generally, the host system 120 employs the memory sub-system 110 to write data to and read data from the memory sub-system 110. For instance, the host system 120 processes these request for reading and/or write data by interacting with the memory sub-system 110, managing the flow of data to and from the memory device 130 and/or the memory device 140 within the memory sub-system 110. This reading and writing of data enables operation of computing systems where data access and management is needed.

In various examples, the memory sub-system 110 includes a read voltage optimization module 113 that can periodically optimize the read voltage(s) that are applied to the memory cells of the memory device 130 to mitigate bit errors resulting from threshold voltage drift. In some examples, the memory sub-system controller 115 includes at least a portion of the read voltage optimization module 113. In some examples, the read voltage optimization module 113 is part of the host system 120, an application or an operating system. In other examples, local media controller 135 includes a portion of the read voltage optimization module 113 and is configured to perform the functionality described herein.

As described above, the read voltage optimization module 113 can be configured to optimize the read voltage that is provided to the memory cells to mitigate bit errors resulting from threshold voltage drift. As an example, the read voltage optimization module 113 can be configured to implement an optimization algorithm in response to a failure to decode a codeword that is read from the memory device 130, such that optimizing the read voltage may mitigate bit errors to facilitate proper decoding of the codeword. As another example, the read voltage optimization module 113 can provide periodic background optimization processes to optimize the read voltage(s) provided to the memory device 130 at each of a given time interval or quantity of read/write operations.

To optimize the read voltage(s), the read voltage optimization module 113 can provide multiple read voltages to determine an approximate amplitude of the threshold voltage of the memory cells of the memory device 130. The determination of the approximate amplitude can be based on determining a threshold voltage bin identifier based on the output provided from the memory cell in response to the multiple read voltages. As described by example herein, the memory cells can be multi-level (e.g., tri-level) memory cells, to which multiple read strobes are provided to determine the multi-bit data stored in each of the memory cells. The threshold voltage bin identifier can thus distinguish the amplitude of the threshold voltage of different logic transitions between different levels of the memory cells. Therefore, as described herein, the multiple read strobes can be provided in different combinations to read the data from the memory cells.

The outputs provided in response to a subset of less than all combinations of read strobe voltages provided to the memory cells can collectively form a respective codeword for each of the combinations. The codewords of the different combinations of read voltages provided to the memory cells of the memory device 130 can correspond to first codewords that have a quantity of less than a total quantity of different combinations of the read strobe voltages. Upon generating the first codewords, different codewords of different combinations of the read strobe voltages that are not provided to the memory cells can be digitally created as second codewords based on the threshold voltage bin identifier of the bits of each of the first codewords. The first and second codewords can, collectively, correspond to all possible combinations of the established set of read strobe voltages. In this manner, the read threshold optimization can mitigate processing overhead by not reading the memory cells with every combination of read strobe voltages.

The first and second codewords are thus provided to a decoder device in the memory sub-system controller 115 to implement a syndrome weight determination procedure (e.g., part of a decoding procedure, such as low-density parity check (LDPC) decoding) on each of the codewords. The syndrome weight determination procedure can thus determine a parity violation count, and thus a respective syndrome weight, for each of the codewords. Given that each of the syndrome weights is associated with a given combination of the read strobe voltages, the lowest syndrome weight can thus correspond to an approximate optimized read voltage.

Figure 1B:
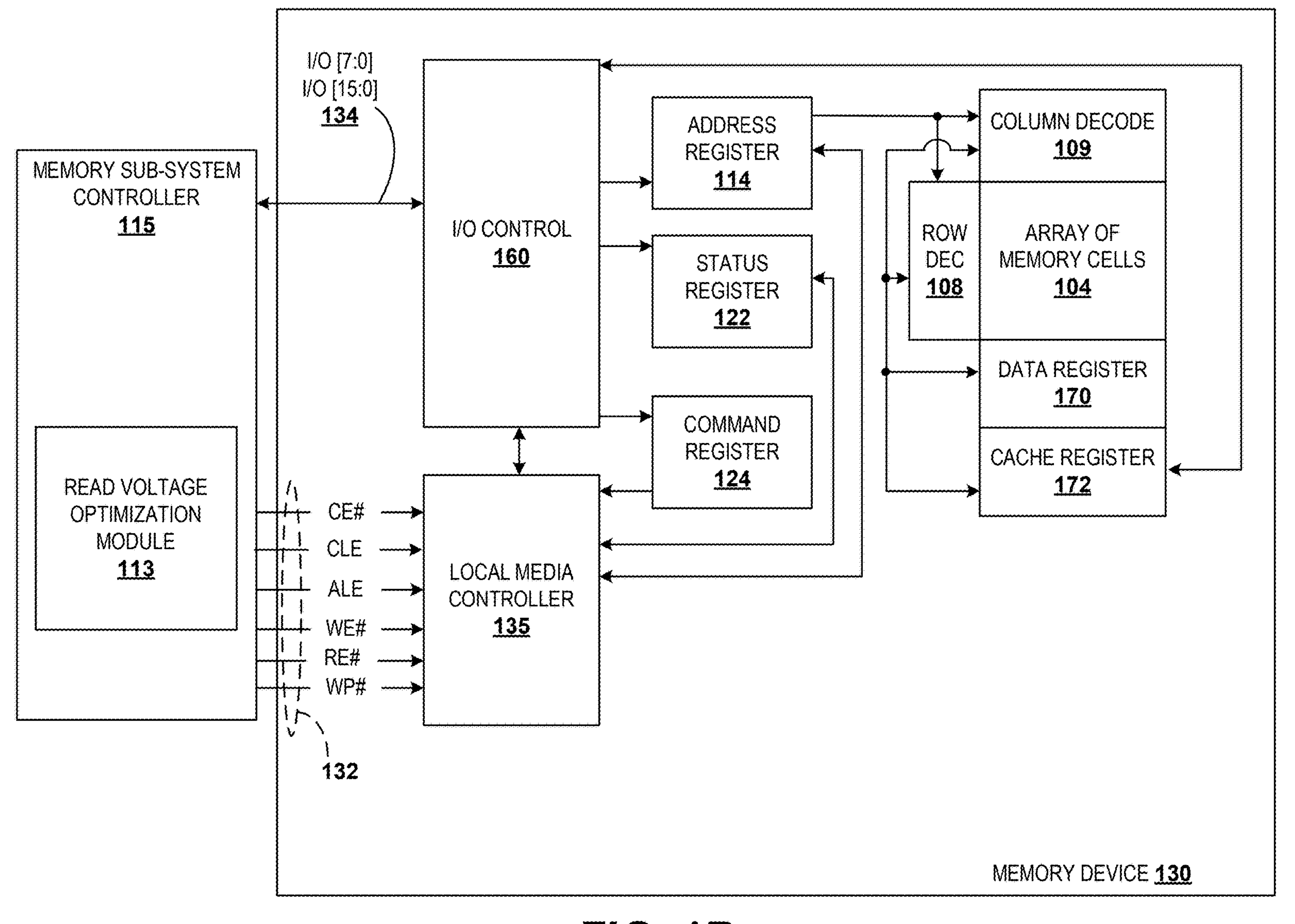
FIG. 1B illustrates a simplified block diagram of an example memory device in communication with a memory sub-system controller.

FIG. 1B illustrates a simplified block diagram of an example of a first apparatus, in the form of a memory device 130, in communication with an example of a second apparatus, in the form of a memory sub-system controller 115 of a memory sub-system (e.g., the memory sub-system 110 of FIG. 1A). Some examples of electronic systems include personal computers, personal digital assistants (PDAs), digital cameras, digital media players, digital recorders, games, appliances, vehicles, wireless devices, mobile telephones, etc. The memory sub-system controller 115 (e.g., a controller external to the memory device 130), can be a memory controller or other external host device.

The memory device 130 includes an array of memory cells 104 logically arranged in rows and columns. As an example, the memory cells 104 can be arranged in an assortment of multiple blocks, with each block including a set of sub-blocks. The blocks/sub-blocks are grouped together to form the planes of the memory device 130. The memory cells 104 form a non-transitory computer-readable medium. Memory cells of a logical row are connected to the same access line (e.g., a wordline) while memory cells of a logical column are selectively connected to the same data line (e.g., a bit line) in some examples. In some examples, a single access line is associated with more than one logical row of memory cells and a single data line may be associated with more than one logical column. Memory cells of at least a portion of the array of memory cells 104 are capable of being programmed to one of at least two target data states.

The memory device 130 includes row decode circuitry 108 and column decode circuitry 109 for decoding address signals. Address signals are received and decoded to access an array of memory cells 104 of the memory device 130. The memory device 130 also includes input/output (I/O) control circuitry 160 to manage input of commands, addresses and data to the memory device 130 as well as output of data and status information from the memory device 130. The memory device 130 has an address register 114 and is in communication with the I/O control circuitry 160, the row decode circuitry 108 and the column decode circuitry 109 to latch the address signals prior to decoding. The memory device 130 also includes a command register 124 in communication with the I/O control circuitry 160 and a local media controller 135 to latch incoming commands.

A controller (e.g., the local media controller 135 internal to the memory device 130) controls access to the array of memory cells 104 in response to the commands and generates status information for the external memory sub-system controller 115. For example, the local media controller 135 is configured to perform access operations (e.g., read operations, programming operations and/or erase operations) on the array of memory cells 104. The local media controller 135 is in communication with the row decode circuitry 108 and the column decode circuitry 109 to control the row decode circuitry 108 and the column decode circuitry 109 in response to the addresses.

As described above in the example of FIG. 1A, the read voltage optimization module 113 can optimize a read voltage that is provided to the memory cells 104 of the memory device 130 during a read operation, such as based on threshold voltage drift of the memory cells 104. The read voltage optimization module 113 can implement a decoding process on codewords read from multiple read voltages (e.g., multiple read strobe voltages for multi-level memory cells 104). The read voltages corresponding to the codeword or codewords that exhibit the lowest syndrome weight can correspond to or can be used to determine the optimized read voltage.

The local media controller 135 is also in communication with a cache register 172. The cache register 172 latches data, either incoming or outgoing, as directed by the local media controller 135 to temporarily store data while the array of memory cells 104 is busy writing or reading, respectively, other data. During a programming operation (e.g., write operation), data is passable from the cache register 172 to the data register 170 for transfer to the array of memory cells 104, and new data can be latched in the cache register 172 from the I/O control circuitry 160. During a read operation, data is passable from the cache register 172 to the I/O control circuitry 160 for output to the memory sub-system controller 115. New data is passable from the data register 170 to the cache register 172. The cache register 172 and/or the data register 170 form (e.g., or form a portion of) a page buffer of the memory device 130. The page buffer includes sensing devices (not shown in FIG. 1B) to sense a data state of a memory cell of the array of memory cells 104. For example, the sensing devices sense a state of a data line connected to that memory cell. The memory device 130 also includes a status register 122 in communication with the I/O control circuitry 160 and the local media controller 135 to latch the status information for output to the memory sub-system controller 115.

The memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE # and/or a write protect signal WP #. Additional or alternative control signals (not shown) can be further received over control link 132 depending upon the nature of the memory device 130. In some examples, the memory device 130 receives command signals (which represent commands), address signals (which represent addresses) and data signals (which represent data) from the memory sub-system controller 115 over a multiplexed input/output (I/O) bus 134 and outputs data to the memory sub-system controller 115 over the I/O bus 134.

In some examples, the commands are received over input/output (I/O) pins [7:0] of the I/O bus 134 at I/O control circuitry 160 and may then be written into the command register 124. The addresses are received over input/output (I/O) pins [7:0] of the I/O bus 134 at I/O control circuitry 160 and written into the address register 114. The data is receivable over input/output (I/O) pins [7:0] for an 8-bit device or input/output (I/O) pins [15:0] for a 16-bit device at I/O control circuitry 160 and is writable into the cache register 172. The data is subsequently written into the data register 170 for programming the array of memory cells 104 in some examples.

In some examples, the cache register 172 is omitted, and in such examples, the data is written directly into the data register 170. Additionally or alternatively, data is output over input/output (I/O) pins [7:0] for an 8-bit device or input/output (I/O) pins [15:0] for a 16-bit device. Moreover, it is noted that although reference is made to I/O pins, in other examples, a different conductive node providing for electrical connection to the memory device 130 by an external device (e.g., the memory sub-system controller 115), such as conductive pads or conductive bumps could be used in addition to or as a replacement for the I/O pins.

The example memory device 130 of FIG. 1B has been simplified. Moreover, in other examples, the functionality of the various block components described with reference to FIG. 1B are not segregated to distinct components or component portions of an integrated circuit device. For example, a single component or component portion of an integrated circuit device could be adapted to perform the functionality of more than one block component of FIG. 1B. Alternatively, components or component portions of an integrated circuit device could be combined to perform the functionality of a single block component of FIG. 1B. Additionally, while specific I/O pins are described in accordance with popular conventions for receipt and output of the various signals, it is noted that other combinations or numbers of I/O pins (or other I/O node structures) are useable in various examples.

Figure 2A:
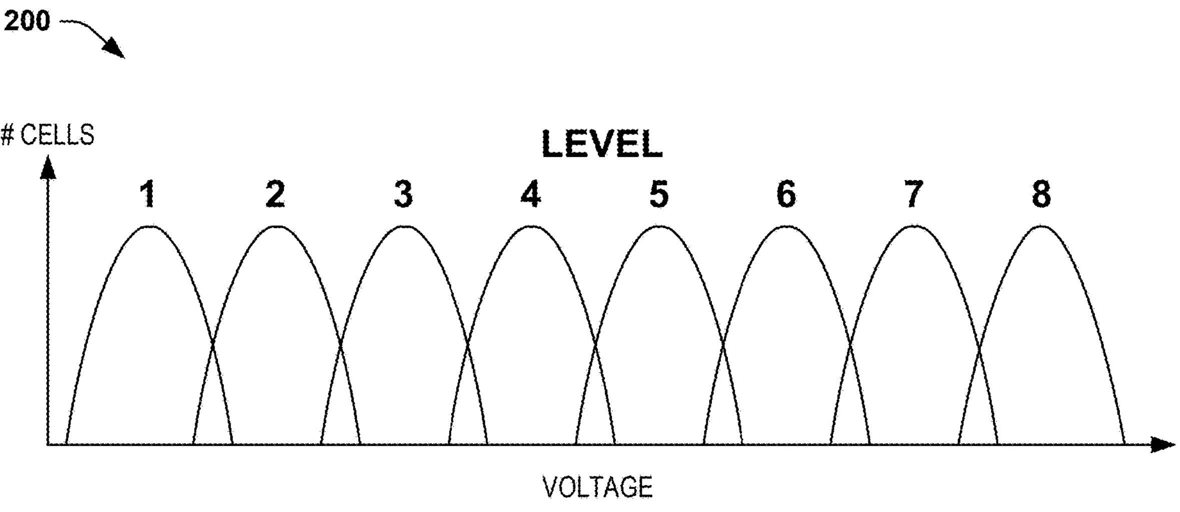
FIG. 2A illustrates an example diagram of voltage levels of a memory cell.

FIG. 2A illustrates an example diagram 200 of voltage levels of a memory cell (e.g., one of the memory cells 104). The diagram 200 demonstrates read voltage levels (e.g., threshold voltages) for reading data from memory cells 104 of the memory device 130 over a quantity of memory cells 104 to be read. The read voltage levels can correspond to programmed states of the array of memory cells 104 of the memory device 130. The example shown in FIG. 2 represents a tri-level memory cell distribution, and thus includes three-bit, e.g., eight-state, memory cells 104. Therefore, the voltage levels represent eight levels, labeled "LEVEL 1" through "LEVEL 8," and thus eight target states to which the memory cells 104 can be programmed.

Figure 2B:
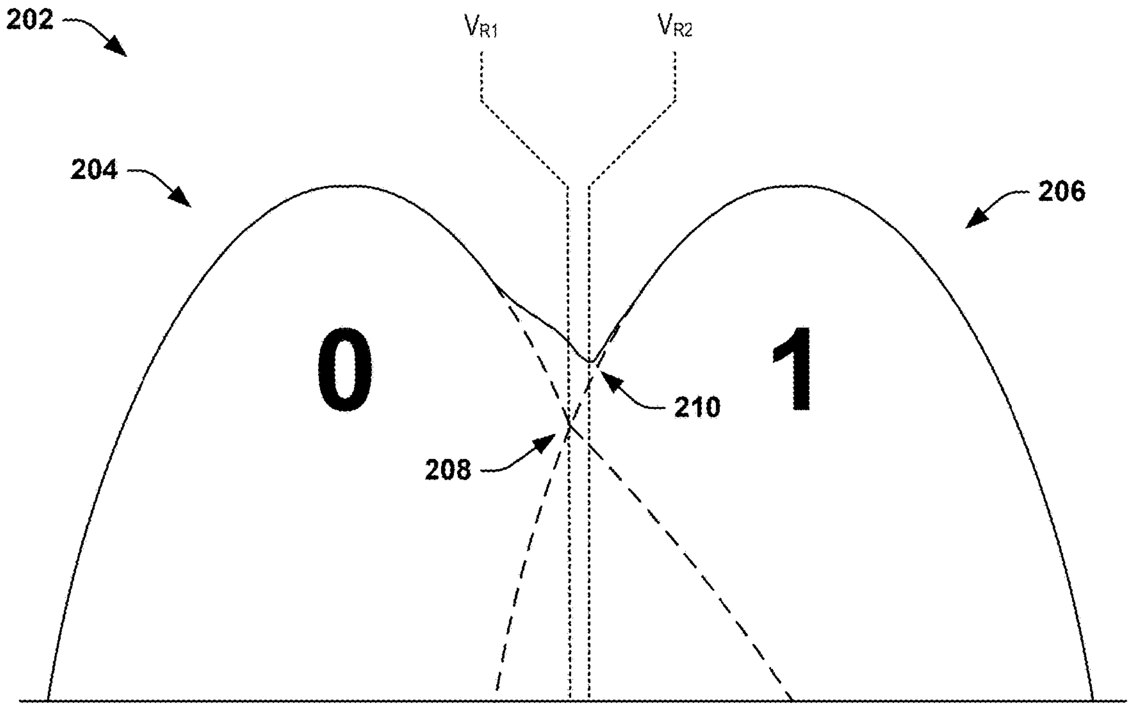
FIG. 2B illustrates an example diagram of voltage levels of a memory cell.

FIG. 2B illustrates an example diagram 202 of voltage levels of a memory cell. The diagram 202 includes a first level 204 and a second level 206 that are representative of a memory cell distribution of logic states. The logic states are demonstrated as a logic-1 for the first level 204 and a logic-0 for the second level 206. The levels 204 and 206 are demonstrated as having an overlap at 208 that corresponds to a smaller distribution of memory cells 104 in which the logic state of the data written can be based on a threshold voltage that can be result in a bit error. If the data that is written to the memory cell 104 is known, then this can be easily correctable. However, if the memory sub-system controller 115 is agnostic as to the data stored in the memory device 130, then having an accurate read voltage can be important to mitigate errors in data read operations.

A read voltage can have a nominal amplitude $V_{R1}$ that is between the levels 204 and 206. The nominal amplitude $V_{R1}$ can thus correspond to an amplitude that yields the fewest bit errors when reading the memory cell. However, as described above, the threshold voltages of the memory cells 104 can drift from any of a variety of stress conditions. The stress factors can cause a disparity in the distributions of the levels, which can thus result in drifting of the threshold voltage of the memory cell. As described above, if the data that is written to the memory cell 104 is known, then errors resulting from such disparity can be easily correctable. However, when the data stored therein is unknown, the distribution can have a valley bottom, demonstrated at 210, that differs from the point of overlap 208 of the memory cell.

Some conventional algorithms can optimize the read voltage based on determining the valley bottom between the levels 204 and 206. The optimized read voltage based on valley bottom determination is demonstrated as a voltage amplitude $V_{R2}$. However, as demonstrated in the example of FIG. 2B, a valley bottom 210 can be offset from the overlap 208 between the levels 204 and 206. As a result, the voltage amplitude $V_{R2}$ can differ from the nominal voltage amplitude $V_{R1}$ based on the disparity between the sides of the valley that increase in population from the valley bottom 210. Therefore, even if the read voltage is optimized to the amplitude $V_{R2}$ corresponding to the valley bottom 210, read operations may still result in significant bit errors.

As described herein, the read voltage optimization module 113 is configured to optimize the read voltage based on implementing a decoding process to determine syndrome weights. By optimizing based on syndrome weights, and thus an approximate count of bit-errors, the read voltage optimization module 113 can optimize the read voltage to an amplitude that is closer to the nominal amplitude $V_{R1}$.

Figures 3A, 3B:
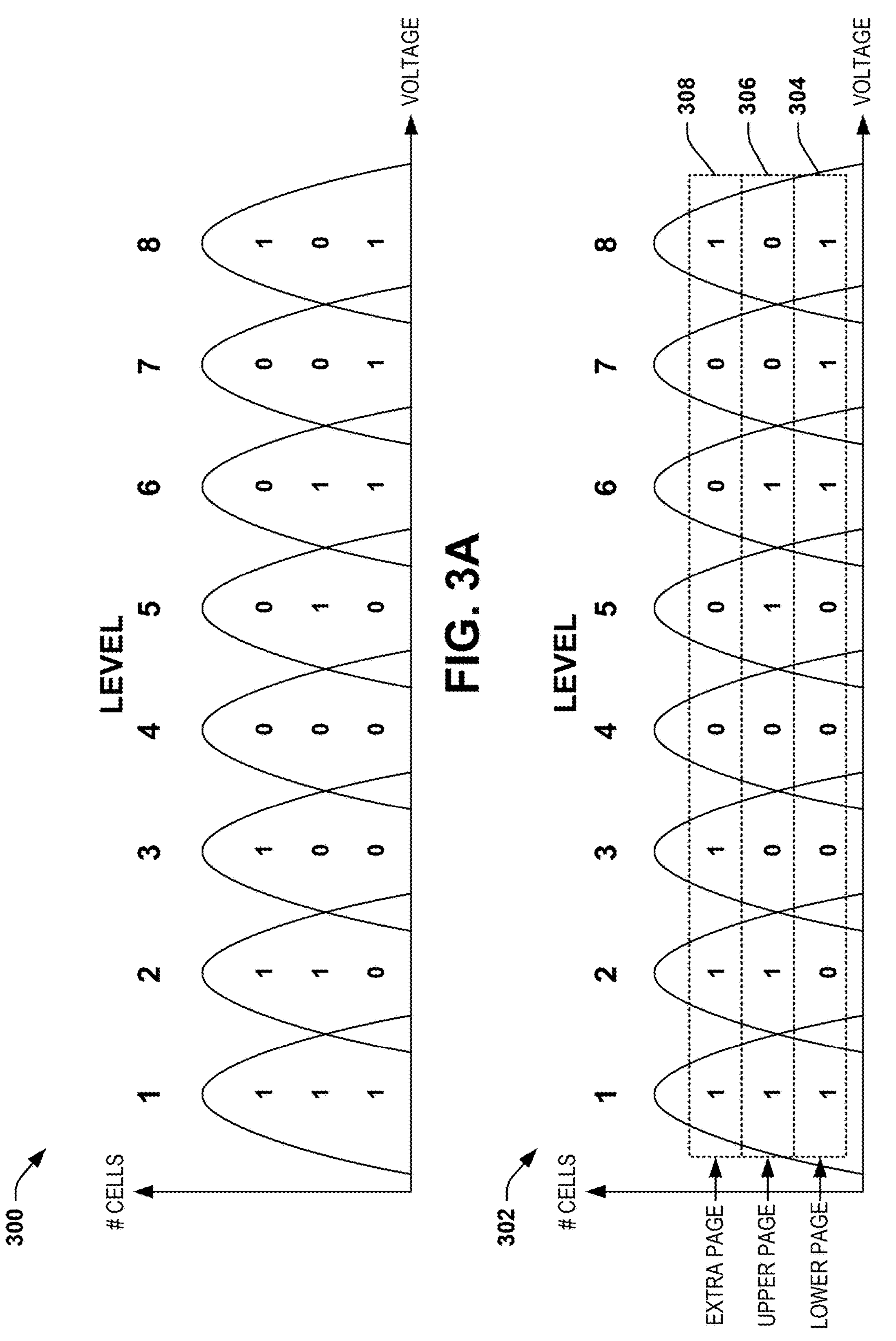
FIG. 3A illustrates another example diagram of voltage levels of a memory cell.
FIG. 3B illustrates another example diagram of voltage levels of a memory cell.

FIGS. 3A and 3B illustrates example diagrams 300 and 302 of voltage levels of a memory cell. The diagram 300 demonstrates read voltage levels (e.g., threshold voltages) for reading data from memory cells 104 of the memory device 130 over a quantity of memory cells 104 to be read. The read voltage levels can correspond to programmed states of the array of memory cells 104 104 of the memory device 130. The examples shown in FIGS. 3A and 3B represent tri-level memory cell distributions, and thus include three-bit, e.g., eight-state, memory cells 104. In the example of FIGS. 3A and 3B, the levels are labeled from “1” through “8”. Therefore, the voltage levels represent eight target states (e.g., logic-0 through logic-7) to which the memory cells 104 can be programmed.

In the example of FIGS. 3A and 3B, the voltage levels are demonstrated with one example of binary values associated with the levels. The binary values are provided in a manner as to provide a binary transition of one of the three bits between each of the levels. As demonstrated in the example of FIG. 3B, the three bits of each level are organized into separate pages. The diagram 302 demonstrates a lower page 304 having a binary transition between level 1 and level 2 (logic-1 to logic-0) and a binary transition between level 5 and level 6 (logic-0 to logic-1). The diagram 302 also demonstrates an upper page 306 having a binary transition between level 2 and level 3 (logic-1 to logic-0), a binary transition between level 4 and level 5 (logic-0 to logic-1), and a binary transition between level 6 and level 7 (logic-1 to logic-0). The diagram 302 demonstrates an extra page 308 having a binary transition between level 3 and level 4 (logic-1 to logic-0) and a binary transition between level 7 and level 8 (logic-0 to logic-1).

Based on the multi-level arrangement of the memory cell 104 described in the examples of FIGS. 3A and 3B, a read operation can be performed based on providing multiple read strobe voltages during a read operation for each of the pages of the memory cell 104 (e.g., the lower page 304, the upper page 306, and the extra page 308). For example, the read strobe voltages can be provided at an amplitude that is nominally equal to the voltage of each of the binary transitions between the levels of the memory cell 104, and thus approximately equal to the voltage $V_{R1}$ in the example of FIG. 2B. As described herein, to optimize the read voltage, the read voltage optimization module 113 can be configured to provide multiple read voltages, and thus multiple read strobe voltages, to each of the memory cells 104 to determine an approximate amplitude of the threshold voltage of the memory cell 104.

Figures 4A, 4B, 4C:
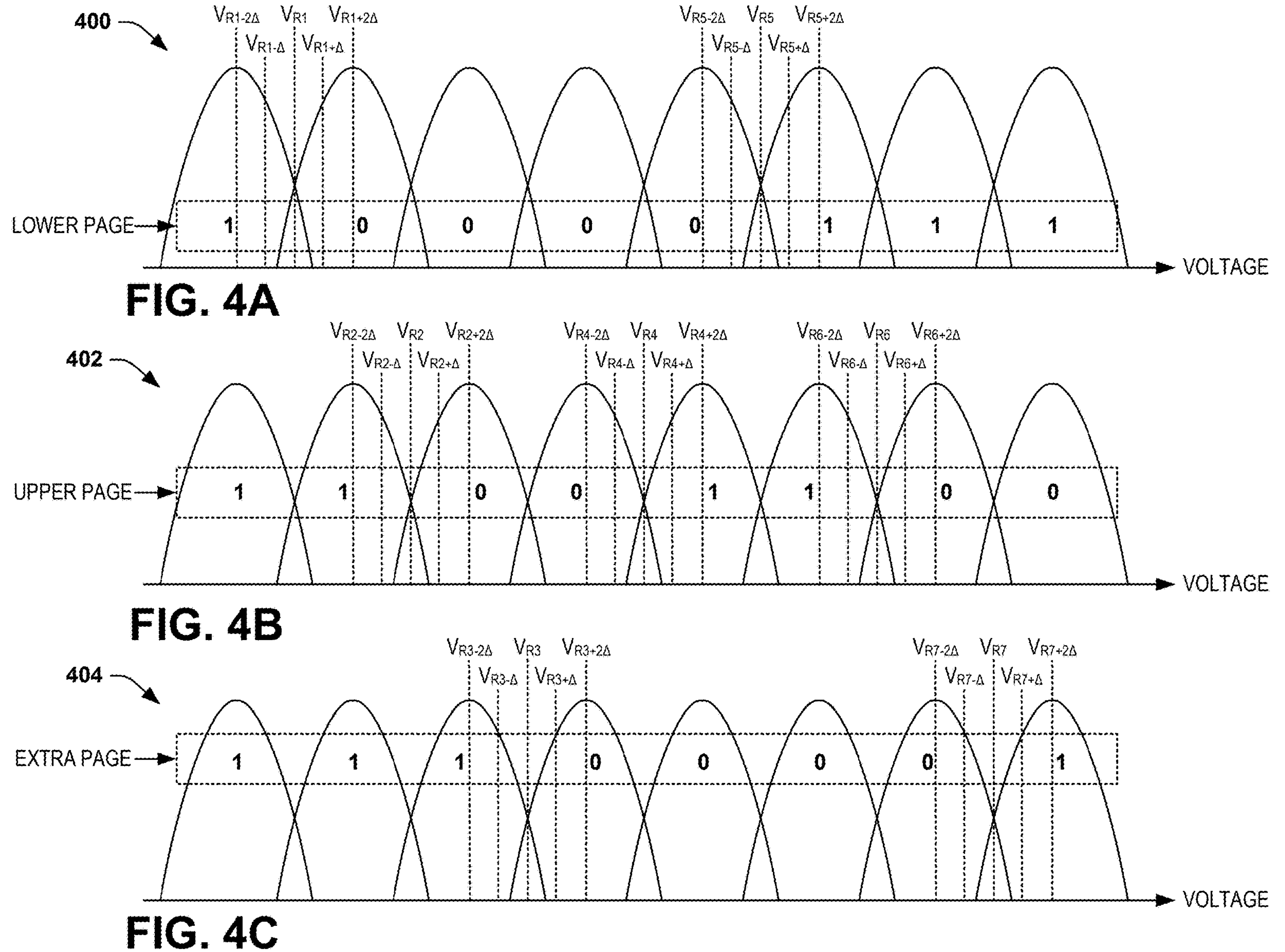
FIG. 4A illustrates another example diagram of providing read voltages to a memory cell.
FIG. 4B illustrates another example diagram of providing read voltages to a memory cell.
FIG. 4C illustrates another example diagram of providing read voltages to a memory cell.

FIGS. 4A through 4C illustrate example diagrams of providing read voltages to a memory cell. FIG. 4A demonstrates an example diagram 400 of providing read strobe voltages to the memory cell 104 for a lower page read operation. FIG. 4B demonstrates an example diagram 402 of providing read strobe voltages to the memory cell 104 for an upper page read operation. FIG. 4C demonstrates an example diagram 404 of providing read strobe voltages to the memory cell 104 for an extra page read operation.

For a typical page read operation of a multi-level memory cell 104, the controller may provide a read strobe voltages that each have an amplitude that is approximately equal to the amplitude of the transition (e.g., valley) between binary states. For example, in a typical page read operation of the extra page 308, the controller can provide a single read strobe voltage having an amplitude approximately equal to the amplitude of the transition (e.g., valley) between levels 3 and 4, and another single read strobe voltage having an amplitude approximately equal to the amplitude of the transition (e.g., valley) between levels 7 and 8. However, in the example of FIGS. 4A through 4C, for the read optimization algorithm described herein the read voltage optimization module 113 provides multiple page read operations. In each page read operation, the read voltage optimization module 113 provides one of a set of read strobe voltages for each transition (e.g., valley) between binary states. The read strobe voltages of each set of read strobe voltages can have an amplitude that is proximal to the amplitude of each transition between binary states. As an example, one read strobe voltage from each set can be provided in a single page read operation, such that the read voltage optimization module 113 can provide five separate page read operations to provide the five separate read strobe voltages in each of the sets of read strobe voltages.

In the examples of FIGS. 4A through 4C, the five read strobe voltages of each set are demonstrated as including a nominal read strobe voltage, two read strobe voltages having opposite polarity and which are equally offset from the nominal read strobe voltage by a first amplitude (+Δ and −Δ), and two read strobe voltages having opposite polarity and which are equally offset from the nominal read strobe voltage by a second amplitude (+2Δ and −2Δ). The “Δ” variable can correspond to any of a variety of offset voltage amplitudes (e.g., 90 mV), and can be uniform for each set of read strobe voltages, such that a set of five read strobe voltages are consecutively greater than each other by an amplitude Δ, and thus equally spaced from next and previous consecutive read strobe voltages.

In the diagram 400, for the lower page read operation, the first set of read strobe voltages are demonstrated as a nominal read strobe voltage $V_{R1}$ that is approximately equal to the binary transition between level 1 and level 2 (logic-1 to logic-0), a first offset read strobe voltage $V_{R1}+\Delta$, a second offset read strobe voltage $V_{R1-\Delta}$, a third offset read strobe voltage $V_{R1+2\Delta}$, and a fourth offset read strobe voltage $V_{R1-2\Delta}$. The second set of read strobe voltages for the lower page read operation are demonstrated as a nominal read strobe voltage $V_{R5}$ that is approximately equal to the binary transition between level 5 and level 6 (logic-0 to logic-1), a first offset read strobe voltage $V_{R5+\Delta}$, a second offset read strobe voltage $V_{R5-\Delta}$, a third offset read strobe voltage $V_{R5+2\Delta}$, and a fourth offset read strobe voltage $V_{R5-2\Delta}$.

In the diagram 402, for the upper page read operation, the first set of read strobe voltages are demonstrated as a nominal read strobe voltage $V_{R2}$ that is approximately equal to the binary transition between level 2 and level 3 (logic-1 to logic-0), a first offset read strobe voltage $V_{R2+\Delta}$, a second offset read strobe voltage $V_{R2-\Delta}$, a third offset read strobe voltage $V_{R2+2\Delta}$, and a fourth offset read strobe voltage $V_{R2-2\Delta}$. The second set of read strobe voltages for the upper page read operation are demonstrated as a nominal read strobe voltage $V_{R4}$ that is approximately equal to the binary transition between level 4 and level 5 (logic-0 to logic-1), a first offset read strobe voltage $V_{R4+\Delta}$, a second offset read strobe voltage V45−Δ, a third offset read strobe voltage $V_{R4+2\Delta}$, and a fourth offset read strobe voltage $V_{R4-2\Delta}$. Because the upper page read operation includes three binary transitions, the diagram 402 further includes a third set of read strobe voltages. The third set of read strobe voltages are demonstrated as a nominal read strobe voltage $V_{R6}$ that is approximately equal to the binary transition between level 6 and level 7 (logic-1 to logic-0), a first offset read strobe voltage $V_{R7+\Delta}$, a second offset read strobe voltage $V_{R7-\Delta}$, a third offset read strobe voltage $V_{R7+2\Delta}$, and a fourth offset read strobe voltage $V_{R7-2\Delta}$.

In the diagram 404, for the extra page read operation, the first set of read strobe voltages are demonstrated as a nominal read strobe voltage $V_{R3}$ that is approximately equal to the binary transition between level 3 and level 4 (logic-1 to logic-0), a first offset read strobe voltage $V_{R3+\Delta}$, a second offset read strobe voltage $V_{R3-\Delta}$, a third offset read strobe voltage $V_{R3+2\Delta}$, and a fourth offset read strobe voltage $V_{R3-2\Delta}$. The second set of read strobe voltages for the lower page read operation are demonstrated as a nominal read strobe voltage $V_{R7}$ that is approximately equal to the binary transition between level 7 and level 8 (logic-0 to logic-1), a first offset read strobe voltage $V_{R7+\Delta}$, a second offset read strobe voltage $V_{R7-\Delta}$, a third offset read strobe voltage $V_{R7+2\Delta}$, and a fourth offset read strobe voltage $V_{R7-2\Delta}$.

As described above, the read voltage optimization module 113 is configured to determine an approximate amplitude of the threshold voltage of the memory cell 104 based on the outputs read from the memory cell 104 in response to the provided set of read strobe voltages. For example, the read voltage optimization module 113 can determine that the threshold voltage of the memory cell 104 has an amplitude between two of the set of read strobe voltages based on the collective set of outputs in response to the applied sets of read strobe voltages. In this manner, the read voltage optimization module 113 can identify with which binary transition the threshold voltage is associated.

Figure 5:
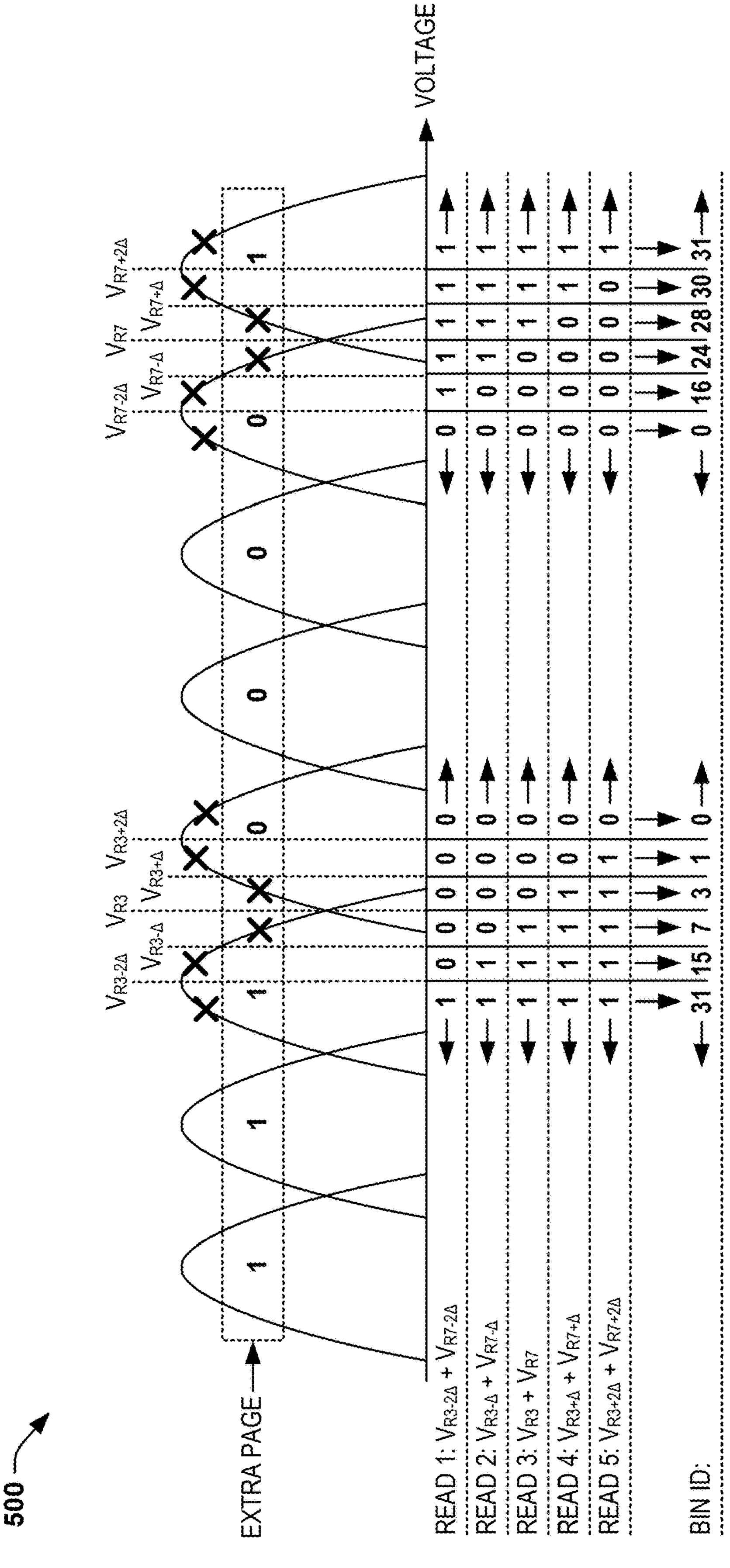
FIG. 5 illustrates an example diagram of threshold voltage bin identifiers.

FIG. 5 illustrates an example diagram 500 of threshold voltage bin identifiers. The diagram 500 is provided with reference to the extra page read operation provided in the diagram 404. Therefore, reference is to be provided to the example of FIG. 4C in the following description of the example of FIG. 5.

Similar to as described above, the diagram 500 demonstrates the first set of read strobe voltages $V_{R3}$, $V_{R3+\Delta}$, $V_{R3-\Delta}$, $V_{R3+2\Delta}$, and $V_{R3-2\Delta}$, and demonstrates the second set of read strobe voltages $V_{R7}$, $V_{R7+\Delta}$, $V_{R7-\Delta}$, $V_{R7+2\Delta}$, and $V_{R7-2\Delta}$. The diagram 500 also demonstrates a set of potential threshold voltages indicated by an "X" proximal to the binary transitions of the extra page between levels 3 and 4 and levels 7 and 8. Particularly, the diagram 500 includes a potential threshold voltage at all possible locations relative to the ten read strobe voltages (e.g., the first set of five read strobe voltages and the second set of five read strobe voltages).

The diagram 500 also includes a set of binary values that are output from the memory cell 104 in response to each read operation, in which the read voltage optimization module 113 applies one read strobe voltage from each of the sets of read strobe voltages. As an example, the memory cell 104 can return a binary value output in response to each single read strobe voltage, with a logic-1 indicating that the read strobe voltage is less than the threshold voltage and a logic-0 indicating that the read strobe voltage is greater than the threshold voltage. To accommodate the binary transition from logic-0 to logic-1 between levels 7 and 8, the memory sub-system controller 115 can aggregate the output binary values of the two applied read strobe voltages from a single read operation (e.g., based on a logic XNOR operation). As a result, the application of the two read strobe voltages (e.g., associated with the voltages $V_{R3}$ and $V_{R7}$ or offsets thereof) can result in a single bit output that maps to the logic states corresponding to the levels of the memory cell 104.

To determine an approximate amplitude of the threshold voltage, the binary values provided by the five read operations, and thus the application of pairs of the read strobe voltages from the respective first and second set, can collectively define a threshold voltage bin identifier that corresponds to the approximate amplitude of the threshold voltage. In the example of FIG. 5, the collective outputs are demonstrated in a column that defines a unique binary code that corresponds to an associated amplitude range defined between a pair of read strobe voltages for relevant amplitudes of interest of the threshold voltage. Therefore, the read voltage optimization module 113 can determine not just the logic-state of the memory cell 104 corresponding to the threshold voltage, but which specific level includes the threshold voltage, and an approximate amplitude of the threshold voltage relative to the nominal amplitudes between the binary transitions of the associated levels (e.g., between levels 3 and 4 and between levels 7 and 8).

The threshold voltage bin identifier ("BIN ID") can be determined based on providing the read operations such that the read strobe voltages are provided in a given order. In the example of FIG. 5, the first read operation corresponds to application of the first offset read strobe voltages $V_{R3-2\Delta}$ and $V_{R7-2\Delta}$. The second read operation corresponds to application of the second offset read strobe voltages $V_{R3-\Delta}$ and $V_{R7-\Delta}$. The third read operation corresponds to application of the nominal read strobe voltages $V_{R3}$ and $V_{R7}$. The fourth read operation corresponds to application of the third offset read strobe voltages $V_{R3+\Delta}$ and $V_{R7+\Delta}$. The fifth read operation corresponds to application of the fourth offset read strobe voltages $V_{R3+2\Delta}$ and $V_{R7+2\Delta}$. The output from the five read operations can thus provide the threshold voltage bin identifier as a five-bit binary code in order from a most significant bit corresponding to the first read operation and a least significant bit corresponding to the last (e.g., fifth) read operation.

In the example of FIG. 5, a first threshold voltage is demonstrated as less than the offset read strobe voltage $V_{R3-2\Delta}$. Because the first threshold voltage is less than the offset read strobe voltage $V_{R3-2\Delta}$, the output from each of the five reads corresponding to five pairs of read strobe voltages is a logic-1. Therefore, the threshold voltage bin identifier ("BIN ID") for the first threshold voltage is 31 (e.g., the binary value of "11111"). Because the first threshold voltage is significantly less than the binary transition between the levels 3 and 4, the read voltage optimization module 113 does not need to further optimize the read voltage in response to determining a threshold voltage amplitude at the first threshold voltage or lower in amplitude.

A second threshold voltage is demonstrated as greater than the offset read strobe voltage $V_{R3-2\Delta}$ but less than the offset read strobe voltage $V_{R3-\Delta}$. Because the second threshold voltage is greater than the offset read strobe voltage $V_{R3-2\Delta}$ and less than the offset read strobe voltage $V_{R3-\Delta}$, the output from the first read operation is logic-0, but the output from second through fifth read operations is logic-1. Therefore, the threshold voltage bin identifier ("BIN ID") for the second threshold voltage is 15 (e.g., the binary value of "01111"). As described in greater detail herein, the threshold voltage bin identifier value of 15 is a unique identifier for the amplitude of any threshold voltage having an amplitude between the read strobe voltages $V_{R3-2\Delta}$ and $V_{R3-\Delta}$. Therefore, the read voltage optimization module 113 can identify that a threshold voltage of the memory cell 104 has an amplitude between the read strobe voltages $V_{R3-2\Delta}$ and $V_{R3-\Delta}$ for purpose of optimizing the read voltage.

A third threshold voltage is demonstrated as greater than the offset read strobe voltage $V_{R3-\Delta}$ but less than the nominal read strobe voltage $V_{R3}$. Because the third threshold voltage is greater than the offset read strobe voltage $V_{R3-\Delta}$ and less than the nominal read strobe voltage $V_{R3}$, the output from the first and second read operations is logic-0, but the output from third through fifth read operations is logic-1. Therefore, the threshold voltage bin identifier ("BIN ID") for the third threshold voltage is 7 (e.g., the binary value of "00111"). The threshold voltage bin identifier value of 7 is a unique identifier for the amplitude of any threshold voltage having an amplitude between the read strobe voltages $V_{R3-\Delta}$ and $V_{R3}$. Therefore, the read voltage optimization module 113 can identify that a threshold voltage of the memory cell 104 has an amplitude between the read strobe voltages $V_{R3-\Delta}$ and $V_{R3}$ for purpose of optimizing the read voltage.

A fourth threshold voltage is demonstrated as greater than the nominal read strobe voltage $V_{R3}$ but less than the offset read strobe voltage $V_{R3+\Delta}$. Because the fourth threshold voltage is greater than the nominal read strobe voltage $V_{R3}$ and less than the offset read strobe voltage $V_{R3+\Delta}$, the output from the first through third read operations is logic-0, but the output from the fourth and fifth read operations is logic-1. Therefore, the threshold voltage bin identifier ("BIN ID") for the fourth threshold voltage is 3 (e.g., the binary value of "00011"). The threshold voltage bin identifier value of 3 is a unique identifier for the amplitude of any threshold voltage having an amplitude between the read strobe voltages $V_{R3}$ and $V_{R3+\Delta}$. Therefore, the read voltage optimization module 113 can identify that a threshold voltage of the memory cell 104 has an amplitude between the read strobe voltages $V_{R3}$ and $V_{R3+\Delta}$ for purpose of optimizing the read voltage.

A fifth threshold voltage is demonstrated as greater than the offset read strobe voltage $V_{R3+\Delta}$ but less than the offset read strobe voltage $V_{R3+2\Delta}$. Because the fifth threshold voltage is greater than the offset read strobe voltage $V_{R3+\Delta}$ and less than the offset read strobe voltage $V_{R3+2\Delta}$, the output from the first through fourth read operations is logic-0, but the output from the fifth read operation is logic-1. Therefore, the threshold voltage bin identifier ("BIN ID") for the fifth threshold voltage is 1 (e.g., the binary value of "00001"). The threshold voltage bin identifier value of 1 is a unique identifier for the amplitude of any threshold voltage having an amplitude between the read strobe voltages $V_{R3+\Delta}$ and $V_{R3+2\Delta}$. Therefore, the read voltage optimization module 113 can identify that a threshold voltage of the memory cell 104 has an amplitude between the read strobe voltages $V_{R3+\Delta}$ and $V_{R3+2\Delta}$ for purpose of optimizing the read voltage.

A sixth threshold voltage and a seventh threshold voltage are demonstrated between the offset read strobe voltage $V_{R3+2\Delta}$ and the offset read strobe voltage $V_{R7-2\Delta}$. Particularly, the sixth threshold voltage is demonstrated as slightly greater than the offset read strobe voltage $V_{R3+2\Delta}$, and the seventh threshold voltage is demonstrated as slightly less than the offset read strobe voltage $V_{R7-2\Delta}$. Because the sixth threshold voltage is greater than the offset read strobe voltage $V_{R3+2\Delta}$, and because the seventh threshold voltage is less than the offset read strobe voltage $V_{R7-2\Delta}$, the output from each of the five read operations for either of the sixth or seventh threshold voltages is a logic-0. Therefore, the threshold voltage bin identifier ("BIN ID") for the sixth and seventh threshold voltages is 0 (e.g., the binary value of "00000"). Because the sixth and seventh threshold voltages are significantly greater than the binary transition between the levels 3 and 4 and significantly less than the binary transition between the levels 7 and 8, the read voltage optimization module 113 does not need to further optimize the read voltage in response to determining a threshold voltage amplitude at the sixth threshold voltage, the seventh threshold voltage, or therebetween.

An eighth threshold voltage is demonstrated as greater than the offset read strobe voltage $V_{R7-2\Delta}$ but less than the offset read strobe voltage $V_{R7-\Delta}$. Because the eighth threshold voltage is greater than the offset read strobe voltage $V_{R7-2\Delta}$ and less than the offset read strobe voltage $V_{R7-\Delta}$, the output from the first read operation is logic-1, but the output from second through fifth read operations is logic-0. Therefore, the threshold voltage bin identifier ("BIN ID") for the eighth threshold voltage is 16 (e.g., the binary value of "10000"). The threshold voltage bin identifier value of 16 is a unique identifier for the amplitude of any threshold voltage having an amplitude between the read strobe voltages $V_{R7-2\Delta}$ and $V_{R7-\Delta}$. Therefore, the read voltage optimization module 113 can identify that a threshold voltage of the memory cell 104 has an amplitude between the read strobe voltages $V_{R7-2\Delta}$ and $V_{R7-\Delta}$ for purpose of optimizing the read voltage.

A ninth threshold voltage is demonstrated as greater than the offset read strobe voltage $V_{R7-\Delta}$ but less than the nominal read strobe voltage $V_{R7}$. Because the ninth threshold voltage is greater than the offset read strobe voltage $V_{R7-\Delta}$ and less than the nominal read strobe voltage $V_{R7}$, the output from the first and second read operations is logic-1, but the output from third through fifth read operations is logic-0. Therefore, the threshold voltage bin identifier ("BIN ID") for the ninth threshold voltage is 24 (e.g., the binary value of "11000"). The threshold voltage bin identifier value of 24 is a unique identifier for the amplitude of any threshold voltage having an amplitude between the read strobe voltages $V_{R7-\Delta}$ and $V_{R7}$. Therefore, the read voltage optimization module 113 can identify that a threshold voltage of the memory cell 104 has an amplitude between the read strobe voltages $V_{R7-\Delta}$ and $V_{R7}$ for purpose of optimizing the read voltage.

A tenth threshold voltage is demonstrated as greater than the nominal read strobe voltage $V_{R7}$ but less than the offset read strobe voltage $V_{R7+\Delta}$. Because the tenth threshold voltage is greater than the nominal read strobe voltage $V_{R7}$ and less than the offset read strobe voltage $V_{R7+\Delta}$, the output from the first through third read operations is logic-1, but the output from the fourth and fifth read operations is logic-0. Therefore, the threshold voltage bin identifier ("BIN ID") for the tenth threshold voltage is 28 (e.g., the binary value of "11100"). The threshold voltage bin identifier value of 28 is a unique identifier for the amplitude of any threshold voltage having an amplitude between the read strobe voltages $V_{R7}$ and $V_{R7+\Delta}$. Therefore, the read voltage optimization module 113 can identify that a threshold voltage of the memory cell 104 has an amplitude between the read strobe voltages $V_{R7}$ and $V_{R7+\Delta}$ for purpose of optimizing the read voltage.

An eleventh threshold voltage is demonstrated as greater than the offset read strobe voltage $V_{R7+\Delta}$ but less than the offset read strobe voltage $V_{R7+2\Delta}$. Because the eleventh threshold voltage is greater than the offset read strobe voltage $V_{R7+\Delta}$ and less than the offset read strobe voltage $V_{R7+2\Delta}$, the output from the first through fourth read operations is logic-1, but the output from the fifth read operation is logic-0. Therefore, the threshold voltage bin identifier ("BIN ID") for the eleventh threshold voltage is 30 (e.g., the binary value of "11110"). The threshold voltage bin identifier value of 30 is a unique identifier for the amplitude of any threshold voltage having an amplitude between the read strobe voltages $V_{R7+\Delta}$ and $V_{R7+2\Delta}$. Therefore, the read voltage optimization module 113 can identify that a threshold voltage of the memory cell 104 has an amplitude between the read strobe voltages $V_{R7+\Delta}$ and $V_{R7+2\Delta}$ for purpose of optimizing the read voltage.

A twelfth threshold voltage is demonstrated as slightly greater than the offset read strobe voltage $V_{R7+2\Delta}$. Because the twelfth threshold voltage is greater than the offset read strobe voltage $V_{R7+2\Delta}$, the output from each of the five read operations for the twelfth threshold voltage is a logic-1. Therefore, the threshold voltage bin identifier ("BIN ID") for the twelfth threshold voltage is 31 (e.g., the binary value of "11111"). Because the twelfth threshold voltage is significantly greater than the binary transition between the levels 7 and 8, the read voltage optimization module 113 does not need to further optimize the read voltage in response to determining a threshold voltage amplitude at the twelfth threshold voltage or higher in amplitude.

The determination of the threshold voltage bin identifier for threshold voltages can be substantially similar for the page reads of other page types. For example, for a lower page read, the binary transition of logic-1 to logic-0 is between levels 1 and 2, and the binary transition of logic-0 to logic-1 is between levels 5 and 6. Therefore, the read voltage optimization module 113 can determine a threshold voltage bin identifier for any threshold voltage of a lower page read in the same manner as the extra page read of the example of FIG. 5. Thus, the threshold voltage bin identifier value is 31 for any threshold voltage less than $V_{R1-2\Delta}$ and greater than $V_{R5+2\Delta}$. Similarly, the threshold voltage bin identifier value is 0 for any threshold voltage between $V_{R1+2\Delta}$ and $V_{R5-2\Delta}$. Similarly, the threshold voltage bin identifier for any other threshold voltage can be a unique binary code that can have the same values as described above in the example of FIG. 5 (e.g., values of 15, 7, 3, and 1 for threshold voltages proximal to the nominal read strobe voltage $V_{R1}$, and values of 16, 24, 28, and 30 for threshold voltages proximal to the nominal read strobe voltage $V_{R5}$).

However, as described above, the upper page of the memory cell includes three binary transitions between levels. Therefore, the determination of the threshold voltage bin identifier for the threshold voltages can include a slight variation to ensure that the threshold voltage bin identifier for all potential amplitudes of the threshold voltages proximal to the binary transitions can be a unique code. For example, because the upper page demonstrated in the example of FIGS. 3B and 4B includes two transitions from logic-1 to logic-0, applying the read strobe voltages in the order demonstrated in the example of FIG. 5 would result in the threshold voltages proximal to the binary transition between level 6 and level 7 having threshold voltage bin identifiers that are the same binary code as the threshold voltage bin identifiers associated with the binary transition between level 2 and level 3 (e.g., 15, 7, 3, and 1). Therefore, the sets of threshold voltage bin identifiers associated with the levels 2 and 3 and the levels 6 and 7 would not be unique binary codes with respect to each other in this example.

Figure 6:
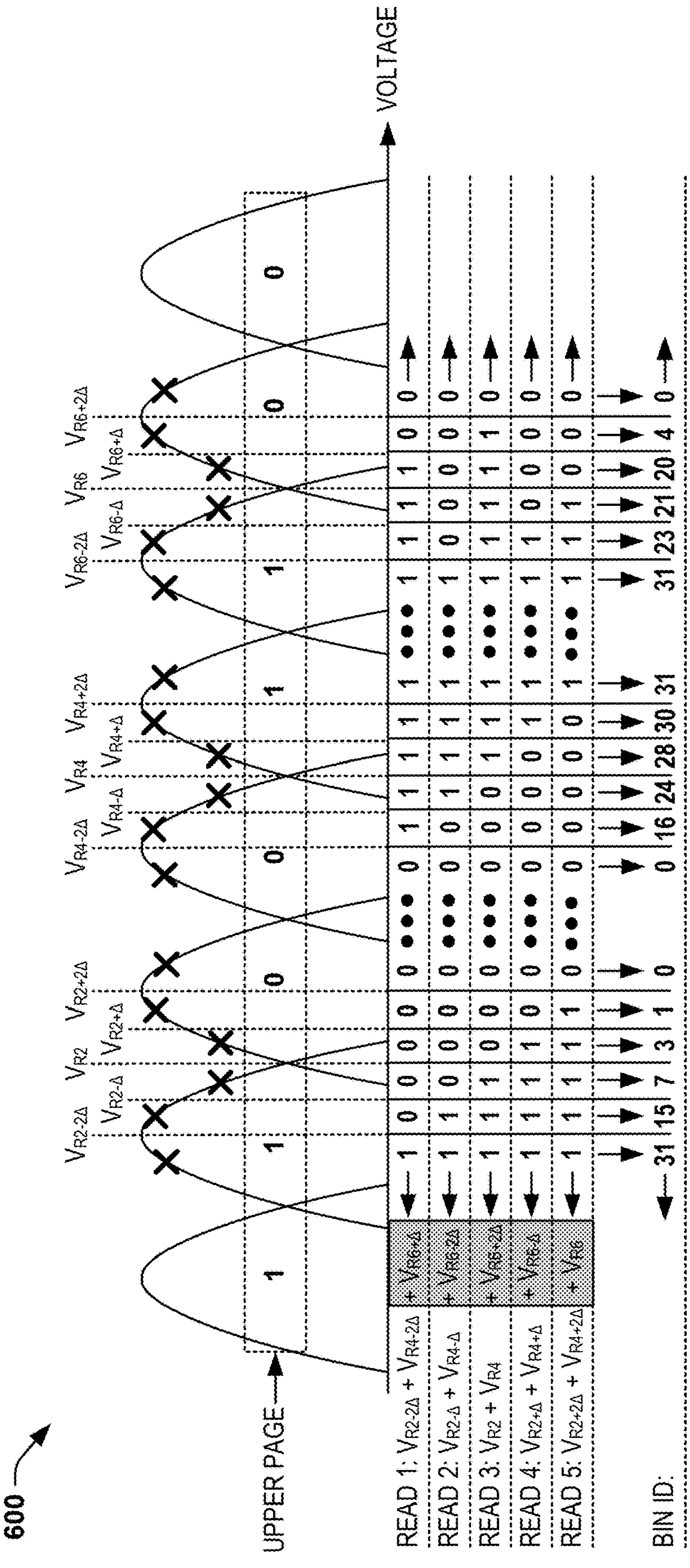
FIG. 6 illustrates another example diagram of threshold voltage bin identifiers.

FIG. 6 illustrates an example diagram 600 of threshold voltage bin identifiers. The diagram 600 is provided with reference to the upper page read operation provided in the diagram 404. Therefore, reference is to be provided to the example of FIG. 4B in the following description of the example of FIG. 6.

Similar to as described above in the example of FIG. 4B, the diagram 600 demonstrates the first set of read strobe voltages $V_{R2}$, $V_{R2+\Delta}$, $V_{R2-\Delta}$, $V_{R2+2\Delta}$, and $V_{R2-2\Delta}$, the second set of read strobe voltages $V_{R4}$, $V_{R4+\Delta}$, $V_{R4-\Delta}$, $V_{R4+2\Delta}$, and $V_{R4-2\Delta}$, and the third set of read strobe voltages $V_{R6}$, $V_{R6+\Delta}$, $V_{R6-\Delta}$, $V_{R6+2\Delta}$, and $V_{R6-2\Delta}$. The diagram 600 also demonstrates a set of potential threshold voltages indicated by an "X" proximal to the binary transitions of the upper page between levels 2 and 3, the levels 4 and 5, and the and levels 6 and 7, similar to as demonstrated in the example of FIG. 5 above.

Similar to as described above, the diagram 600 also includes a set of binary values that are output from the memory cell 104 in response to each read operation, in which the read voltage optimization module 113 applies one read strobe voltage from each of the sets of read strobe voltages. To determine the approximate amplitude of a threshold voltage, the binary values provided by the five read operations collectively define a threshold voltage bin identifier that corresponds to the approximate amplitude of the threshold voltage. The threshold voltage bin identifier ("BIN ID") can be determined based on providing the read operations such that the read strobe voltages are provided in a given order. Similar to as described above in the example of FIG. 5, the first read operation corresponds to application of the first offset read strobe voltages $V_{R2-2\Delta}$ and $V_{R4-2\Delta}$. The second read operation corresponds to application of the second offset read strobe voltages $V_{R2-\Delta}$ and $V_{R4-\Delta}$. The third read operation corresponds to application of the nominal read strobe voltages $V_{R2}$ and $V_{R4}$. The fourth read operation corresponds to application of the third offset read strobe voltages $V_{R2+\Delta}$ and $V_{R4+\Delta}$. The fifth read operation corresponds to application of the fourth offset read strobe voltages $V_{R2+2\Delta}$ and $V_{R4+2\Delta}$.

In the example of FIG. 6, the read voltage optimization module 113 can determine a threshold voltage bin identifier for any threshold voltage of the binary transitions between levels 2 and 3 and levels 4 and 5 in the same manner as the extra page read of the example of FIG. 5. Thus, the threshold voltage bin identifier value is 31 for any threshold voltage less than the first offset read strobe voltage $V_{R2-2\Delta}$ and between the offset voltages than $V_{R4+2\Delta}$ and $V_{R6-2\Delta}$. Similarly, the threshold voltage bin identifier value is 0 for any threshold voltage between $V_{R2+2\Delta}$ and $V_{R4-2\Delta}$. In addition, the threshold voltage bin identifiers for threshold voltages that are proximal to the binary transitions between levels 2 and 3 and levels 4 and 5 can have a same unique binary code as the binary transitions between levels 3 and 4 and levels 7 and 8, respectively, in the example of FIG. 5. Thus, the threshold voltages proximal to the binary transition between levels 2 and 3 can have threshold voltage bin identifier values of 15, 7, 3, and 1, and the threshold voltages proximal to the binary transition between levels 4 and 5 can have threshold voltage bin identifier values of 16, 24, 28, and 30.

Because the binary transition between levels 6 and 7 from logic-1 to logic-0 is the same as the binary transition between levels 2 and 4 from logic-1 to logic-0, application of the read strobe voltages in the same order as described above would not result in a unique binary code. In other words, providing the read strobe voltages in the order of the first read of read strobe voltages $V_{R2-2\Delta}$, $V_{R4-2\Delta}$, and $V_{R6-2\Delta}$, the second read of read strobe voltages $V_{R2-\Delta}$, $V_{R4-\Delta}$, and $V_{R6-\Delta}$, the third read of read strobe voltages $V_{R2}$, $V_{R4}$, and $V_{R6}$, the fourth read of read strobe voltages $V_{R2+\Delta}$, $V_{R4+\Delta}$, and $V_{R6+\Delta}$, and the fifth read of read strobe voltages $V_{R2+2\Delta}$, $V_{R4+2\Delta}$, and $V_{R6+2\Delta}$ would provide for the threshold voltages proximal to the binary transition between levels 6 and 7 having threshold voltage bin identifier values of 15, 7, 3, and 1, and thus the same as the threshold voltage bin identifier values of the threshold voltages proximal to the binary transition between levels 2 and 3. Accordingly, the threshold voltage bin identifier values would not be unique binary codes, and the read voltage optimization module 113 would be unable to distinguish a logic-0 or a logic-1 as being associated with the binary transition between levels 2 and 3 or between levels 6 and 7.

To provide for a unique binary code for the binary transition between levels 6 and 7, the read voltage optimization module 113 can provide the read strobe voltages $V_{R6-2\Delta}$, $V_{R6-\Delta}$, $V_{R6}$, $V_{R6+\Delta}$, and $V_{R6+2\Delta}$ for the binary transition between levels 6 and 7 in a different order relative to the read strobe voltages $V_{R2-2\Delta}$, $V_{R2-\Delta}$, $V_{R2}$, $V_{R2+\Delta}$, and $V_{R2+2\Delta}$ for the binary transition between levels 2 and 3. Therefore, the outputs read from the memory cell 104 are provided in a different sequence from most significant bit to least significant bit, and thus in a unique binary code relative to the other binary transitions. The difference in order of application of the read strobe voltages $V_{R6-2\Delta}$, $V_{R6-\Delta}$, $V_{R6}$, $V_{R6+\Delta}$, and $V_{R6+2\Delta}$ is demonstrated at 602.

In the example of FIG. 6, in the first read operation, the read strobe voltages $V_{R2-2\Delta}$, $V_{R4-2\Delta}$, and $V_{R6+\Delta}$ are provided. In the second read operation, the read strobe voltages $V_{R2-\Delta}$, $V_{R4-\Delta}$, and $V_{R6-2\Delta}$ are provided. In the third read operation, the read strobe voltages $V_{R2}$, $V_{R4}$, and $V_{R6+2\Delta}$ are provided. In the fourth read operation, the read strobe voltages $V_{R2+\Delta}$, $V_{R4+\Delta}$, and $V_{R6-\Delta}$ are provided. In the fifth read operation, the read strobe voltages $V_{R2+2\Delta}$, $V_{R4+2\Delta}$, and $V_{R6}$ are provided. The resulting order of outputs provided in response to the read strobe voltages $V_{R6+\Delta}$, $V_{R6-2\Delta}$, $V_{R6+2\Delta}$, $V_{R6-\Delta}$, and $V_{R6}$ is different from the order of outputs provided in response to the read strobe voltages $V_{R2-2\Delta}$, $V_{R2-\Delta}$, $V_{R2}$, $V_{R2+\Delta}$, and $V_{R2+2\Delta}$ to provide different and unique binary codes.

A first threshold voltage is demonstrated as greater than the offset read strobe voltage $V_{R6-2\Delta}$ but less than the offset read strobe voltage $V_{R6-\Delta}$. Because the first threshold voltage is greater than the offset read strobe voltage $V_{R6-2\Delta}$ and less than the offset read strobe voltage $V_{R6-\Delta}$, the output from the first read operation is logic-1, the output from the second read operation is logic-0, and the output from the third through fifth read operations is logic-1. Therefore, the threshold voltage bin identifier ("BIN ID") for the first threshold voltage is 23 (e.g., the binary value of "10111"). The threshold voltage bin identifier value of 23 is thus a unique identifier for the amplitude of any threshold voltage having an amplitude between the read strobe voltages $V_{R6-2\Delta}$ and $V_{R6-\Delta}$. Therefore, the read voltage optimization module 113 can identify that a threshold voltage of the memory cell 104 has an amplitude between the read strobe voltages $V_{R6-2\Delta}$ and $V_{R6-\Delta}$ for purpose of optimizing the read voltage.

A second threshold voltage is demonstrated as greater than the offset read strobe voltage $V_{R6-\Delta}$ but less than the nominal read strobe voltage $V_{R6}$. Because the second threshold voltage is greater than the offset read strobe voltage $V_{R6-\Delta}$ and less than the nominal read strobe voltage $V_{R6}$, the output from the first read operation is logic-1, the output from the second read operation is logic-0, the output from the third read operation is logic-1, the output from the fourth read operation is logic-0, and the output from the fifth read operation is logic-1. Therefore, the threshold voltage bin identifier ("BIN ID") for the second threshold voltage is 21 (e.g., the binary value of "10101"). The threshold voltage bin identifier value of 21 is a unique identifier for the amplitude of any threshold voltage having an amplitude between the read strobe voltages $V_{R6-\Delta}$ and $V_{R6}$. Therefore, the read voltage optimization module 113 can identify that a threshold voltage of the memory cell 104 has an amplitude between the read strobe voltages $V_{R6-\Delta}$ and $V_{R6}$ for purpose of optimizing the read voltage.

A third threshold voltage is demonstrated as greater than the nominal read strobe voltage $V_{R6}$ but less than the offset read strobe voltage $V_{R6+\Delta}$. Because the third threshold voltage is greater than the nominal read strobe voltage $V_{R6}$ and less than the offset read strobe voltage $V_{R6+\Delta}$, the output from the first read operation is logic-1, the output from the second read operation is logic-0, the output from the third read operation is logic-1, and the output from the fourth and fifth read operations is logic-0. Therefore, the threshold voltage bin identifier ("BIN ID") for the third threshold voltage is 20 (e.g., the binary value of "10100"). The threshold voltage bin identifier value of 20 is a unique identifier for the amplitude of any threshold voltage having an amplitude between the read strobe voltages $V_{R6}$ and VR6+Δ. Therefore, the read voltage optimization module 113 can identify that a threshold voltage of the memory cell 104 has an amplitude between the read strobe voltages $V_{R6}$ and VR6+Δ for purpose of optimizing the read voltage.

A fourth threshold voltage is demonstrated as greater than the offset read strobe voltage VR6+Δ but less than the offset read strobe voltage $V_{R6+2\Delta}$. Because the fourth threshold voltage is greater than the offset read strobe voltage VR6+Δ and less than the offset read strobe voltage $V_{R6+2\Delta}$, the output from the first and second read operations is logic-0, the output from the third read operation is logic-1, and the output from the fourth and fifth read operations is logic-0. Therefore, the threshold voltage bin identifier ("BIN ID") for the fourth threshold voltage is 4 (e.g., the binary value of "00100"). The threshold voltage bin identifier value of 4 is a unique identifier for the amplitude of any threshold voltage having an amplitude between the read strobe voltages VR6+Δ and $V_{R6+2\Delta}$. Therefore, the read voltage optimization module 113 can identify that a threshold voltage of the memory cell 104 has an amplitude between the read strobe voltages VR6+Δ and $V_{R6+2\Delta}$ for purpose of optimizing the read voltage.

Accordingly, the example of FIG. 6 demonstrates that, by changing the order of the application of the read strobe voltages for one binary transition between levels relative to another binary transition between levels, different unique binary codes for the threshold voltage bin identifier can be provided. Such unique binary codes can thus be applicable for other page reads that can include three or more different binary transitions between levels.

Figure 7:
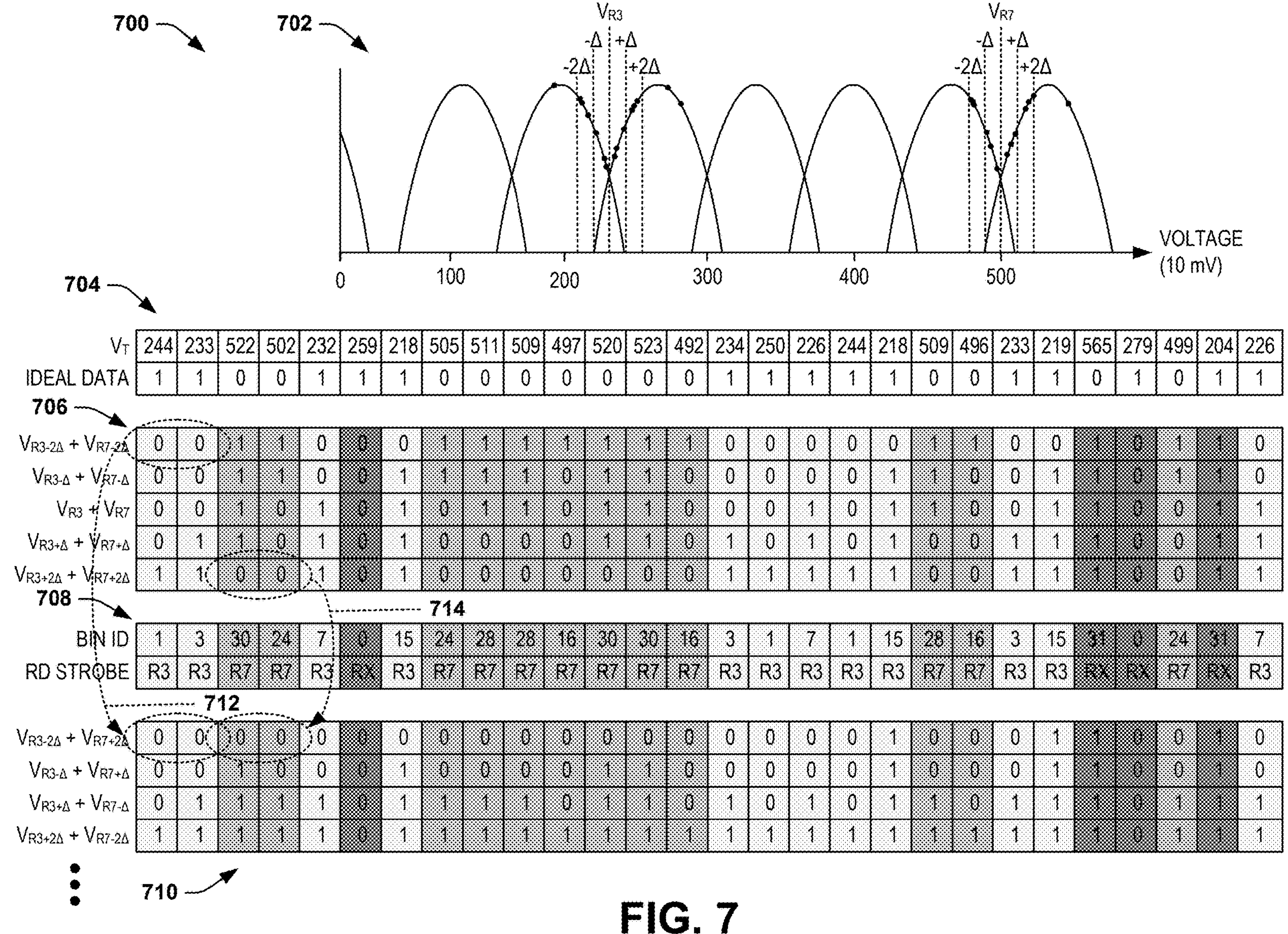
FIG. 7 illustrates an example diagram of reading codewords of a row of memory cells.

FIG. 7 illustrates an example diagram 700 of reading codewords of a row of memory cells. The diagram 700 includes an example of a graph of memory cell levels plotted as a function of voltage at 702, in which a plurality of threshold voltages are plotted on the levels. In the example of FIG. 7, an extra page read is being implemented, similar to as described above in the example of FIG. 5. Therefore, the graph 702 is demonstrated as including the read strobe voltages $V_{R3-2\Delta}$, $V_{R3-\Delta}$, $V_{R3}$, $V_{R3+\Delta}$, and $V_{R3+2\Delta}$ provided proximal to the binary transition between levels 2 and 3 and the read strobe voltages $V_{R7-2\Delta}$, $V_{R7-\Delta}$, $V_{R7}$, $V_{R7+\Delta}$, and $V_{R7+2\Delta}$ provided proximal to the binary transition between levels 7 and 8. The graph 702 is plotted to demonstrate the voltage corresponding to the levels, and thus the threshold voltages (e.g., measured in increments of 10 mV).

The diagram 700 also includes a set of voltage values of each of a plurality of threshold voltages ("$V_T$"), along with corresponding ideal data, demonstrated at 704. For example, each of the threshold voltages can correspond to a single memory cell for the extra page read, such as along a row of an array of memory cells 104. The ideal data can correspond to a known binary value that is stored in each of the memory cells, such as from a prior data write operation to the extra page. While the example of FIG. 7 demonstrates only twenty-eight threshold voltages, a given extra page read could include reading thousands of memory cells (e.g., 4+ kb).

The diagram 700 also demonstrates the five read operations for each of the memory cells at 706. The five read operations correspond to application of one of each of the sets of five read strobe voltages, such as described above in the examples of FIGS. 4C and 5. Particularly, the read operations 706 are demonstrated as a first read operation that provides the first offset read strobe voltages $V_{R3-2\Delta}$ and $V_{R7-2\Delta}$, a second read operation that provides the second offset read strobe voltages $V_{R3-\Delta}$ and $V_{R7-\Delta}$, a third read operation that provides the nominal read strobe voltages $V_{R3}$ and $V_{R7}$, a fourth read operation that provides the third offset read strobe voltages $V_{R3+\Delta}$ and $V_{R7+\Delta}$, and a fifth read operation that provides the fourth offset read strobe voltages $V_{R3+2\Delta}$ and $V_{R7+2\Delta}$. As described above, application of the pair of read strobe voltages from the respective sets associated with the binary transitions between the levels 3 and 4 and the levels 7 and 8 results in a single-bit output that is an aggregation of the readout from the two read strobe voltages in each read operation. Therefore, the five read operations 706 demonstrate the single-bit output from each respective read operation for each respective memory cell 104.

The diagram 700 also includes a threshold voltage bin identifier ("BIN ID") that is assigned to each one of the threshold voltages, as determined by the outputs of the five read operations, along with a designation as to with which read strobe the output is associated, at 708. In the example of FIG. 7, the outputs are demonstrated in the example of FIG. 7 as being shaded to correspond to the specific one of the read strobes (e.g., R3, R7, or RX for neither) to which the output is associated. The outputs demonstrated in the lightest shading correspond to the read strobe R3, and thus the measured threshold voltage has an amplitude that is between two consecutive read strobe voltages $V_{R3-2\Delta}$, $V_{R3-\Delta}$, $V_{R3}$, $V_{R3+\Delta}$, and $V_{R3+2\Delta}$. The outputs demonstrated in the medium shading correspond to the read strobe R7, and thus the measured threshold voltage has an amplitude that is between two consecutive read strobe voltages $V_{R7-2\Delta}$, $V_{R7-\Delta}$, $V_{R7}$, $V_{R7+\Delta}$, and $V_{R7+2\Delta}$. The outputs demonstrated in the darkest shading correspond to the threshold voltages that are less than the read strobe voltage $V_{R3-2\Delta}$, between the read strobe voltages $V_{R3+2\Delta}$ and $V_{R7-2\Delta}$, or greater than the read strobe voltage $V_{R7+2\Delta}$.

Because the lightest-shaded outputs have measured threshold voltage amplitudes between two consecutive read strobe voltages $V_{R3-2\Delta}$, $V_{R3-\Delta}$, $V_{R3}$, $V_{R3+\Delta}$, and $V_{R3+2\Delta}$, each of the lightest-shaded outputs has a value of the threshold voltage bin identifier that is a unique binary code corresponding to the approximate amplitude of the corresponding threshold voltage. Therefore, each of the lightest-shaded outputs has a threshold voltage bin identifier value of 15 if the threshold voltage is between the read strobe voltages $V_{R3-2\Delta}$ and $V_{R3-\Delta}$, a threshold voltage bin identifier value of 7 if the threshold voltage is between the read strobe voltages $V_{R3-\Delta}$ and $V_{R3}$, a threshold voltage bin identifier value of 3 if the threshold voltage is between the read strobe voltages $V_{R3}$ and $V_{R3+\Delta}$, or a threshold voltage bin identifier value of 1 if the threshold voltage is between the read strobe voltages $V_{R3+\Delta}$ and $V_{R3+2\Delta}$. The unique binary code is thus indicative of to which read strobe (R3, in the above described example), the respective threshold voltage is associated.

Similarly, because the medium-shaded outputs have measured threshold voltage amplitudes between two consecutive read strobe voltages $V_{R7-2\Delta}$, $V_{R7-\Delta}$, $V_{R7}$, $V_{R7+\Delta}$, and $V_{R7+2\Delta}$, each of the medium-shaded outputs has a value of the threshold voltage bin identifier that is a unique binary code corresponding to the approximate amplitude of the corresponding threshold voltage. Therefore, each of the medium-shaded outputs has a threshold voltage bin identifier value of 16 if the threshold voltage is between the read strobe voltages $V_{R7-2\Delta}$ and $V_{R7-\Delta}$, a threshold voltage bin identifier value of 24 if the threshold voltage is between the read strobe voltages $V_{R7-\Delta}$ and $V_{R7}$, a threshold voltage bin identifier value of 28 if the threshold voltage is between the read strobe voltages $V_{R7}$ and $V_{R7+\Delta}$, or a threshold voltage bin identifier value of 30 if the threshold voltage is between the read strobe voltages $V_{R7+\Delta}$ and $V_{R7+2\Delta}$. The unique binary code is thus indicative of to which read strobe (R7, in the above described example), the respective threshold voltage is associated.

The darkest-shaded outputs have measured threshold voltage amplitudes that are less than the read strobe voltage $V_{R3-2\Delta}$, between the read strobe voltages $V_{R3+2\Delta}$ and $V_{R7-2\Delta}$, or greater than the read strobe voltage $V_{R7+2\Delta}$. Therefore, the read voltage optimization module 113 does not consider the darkest-shaded outputs for purposes of optimizing the read voltage. Each of the darkest-shaded outputs has a threshold voltage bin identifier value of 31 if the threshold voltage is less than the read strobe voltage $V_{R3-2\Delta}$ or greater than the read strobe voltage $V_{R7+2\Delta}$, and a threshold voltage bin identifier value of 0 if the threshold voltage is between the read strobe voltages $V_{R3+2\Delta}$ and $V_{R7-2\Delta}$. The darkest-shaded outputs are thus assigned to neither of the read strobes R3 or R7, and is thus designated RX.

The outputs of each of the memory cells 104 (e.g., in the row of memory cells 104) for each of the read operations can thus form a codeword. Therefore, the five read operations can provide five respective codewords that are associated with the combination of read strobe voltages provided by the respective read operation. Therefore, there is a first codeword associated with the first read operation that provides the read strobe voltages $V_{R3-2\Delta}$ and $V_{R7-2\Delta}$, a second codeword associated with the second read operation that provides the read strobe voltages $V_{R3-\Delta}$ and $V_{R7-\Delta}$, a third codeword associated with the third read operation that provides the strobe voltages $V_{R3}$ and $V_{R7}$, a fourth codeword associated with the fourth read operation that provides the read strobe voltages $V_{R3+\Delta}$ and $V_{R7+\Delta}$, and a fifth codeword associated with the fifth read operation that provides the read strobe voltages $V_{R3+2\Delta}$ and $V_{R7+2\Delta}$.

The set of codewords is thus associated with a first set of combinations of one read strobe voltage from each of the sets of read strobe voltages of the respective read strobes (R3 and R7). Because there are a total of five read strobe voltages in each of the sets of read strobe voltages, the total quantity of combinations of read strobe voltages in the example of FIG. 7 is twenty-five ($5R3 \times 5R7 = 5^2$). The combinations of read strobe voltages provided in the five read operations thus has a quantity that is less than all possible combinations of read strobe voltages that could be provided in different read operations. Therefore, the codewords resulting from the outputs of the five read operations correspond to a first set of codewords having a quantity that is a proper subset of all the codewords that can be read from the memory cells 104 based on the remaining combinations of read strobe voltages.

As described herein, the read voltage optimization module 113 is configured to optimize the read voltage based on the syndrome weight of the codewords generated from all possible combinations of read strobe voltages in respective read operations. The read voltage optimization module 113 could provide read operations that implement every combination of the read strobe voltages to obtain all of the codewords for which the read voltage can be optimized based on respective syndrome weights. However, implementing a total of twenty-five read operations requires significantly more time and computational overhead than merely implementing five read operations. Furthermore, as described in greater detail herein, the total possible combinations is even greater for more than two binary transitions between levels, such as for the upper page described in the example of FIG. 6 (e.g., 5R2×5R4×5R6=$5^3$=125).

To mitigate time and computational overhead, the read voltage optimization module 113 is configured to digitally create the remaining codewords based on the outputs of the five read operations and the threshold voltage bin identifiers associated with the respective outputs. The digital creation of the remaining codewords is demonstrated in the example of FIG. 7 at 710, in which codewords associated with different combinations of the read strobe voltages that were not implemented in the five read operations are created. To digitally create the remaining codewords associated with the different read strobe voltages, the read voltage optimization module 113 identifies with which read strobe the respective outputs are associated, and copies the outputs from the respective corresponding codeword of the first set of codewords (provided from the actual read operations) into the new digitally created codeword.

The first of the remaining codewords that is digitally created is demonstrated at 710 as being based on the read strobe voltages $V_{R3-2\Delta}$ and $V_{R7+2\Delta}$. To digitally create the codeword associated with the read strobe voltages $V_{R3-2\Delta}$ and $V_{R7+2\Delta}$, the read voltage optimization module 113 identifies that the first two outputs are associated with the read strobe R3 based on the threshold voltage bin identifier values (e.g., 1 and 3, respectively). Therefore, the read voltage optimization module 113 copies the outputs from the codeword of the first set of codewords that implements the same read strobe voltage associated with the respective read strobe R3. In this example, because the first of the digitally created codewords includes the combination of the read strobe voltages $V_{R3-2\Delta}$ and $V_{R7+2\Delta}$, and because the output of the memory cell 104 from the five read operations are associated with the read strobe R3, the read voltage optimization module 113 copies the outputs of the respective one of the first set of codewords that includes the read strobe voltage $V_{R3-2\Delta}$ in the respective combination of read strobe voltages. This is demonstrated in the example of FIG. 7 at 712.

After copying the first two output bits from the first codeword of the read operations to the first digitally created codeword, the read voltage optimization module 113 then identifies that the next two outputs are associated with the read strobe R7 based on the threshold voltage bin identifier values (e.g., 30 and 24, respectively). Therefore, the read voltage optimization module 113 copies the outputs from the codeword of the first set of codewords that implements the same read strobe voltage associated with the respective read strobe R7. In this example, because the first of the digitally created codewords includes the combination of the read strobe voltages $V_{R3-2\Delta}$ and $V_{R7+2\Delta}$, and because the output of the memory cell 104 from the five read operations are associated with the read strobe R7, the read voltage optimization module 113 copies the outputs of the respective one of the first set of codewords that includes the read strobe voltage $V_{R7+2\Delta}$ in the respective combination of read strobe voltages. This is demonstrated in the example of FIG. 7 at 714.

The read voltage optimization module 113 can thus continue to copy output bits from the codewords of the read operations associated with the combinations of the read strobe voltages $V_{R3-2\Delta}$ and $V_{R7-2\Delta}$ and the read strobe voltages $V_{R3+2\Delta}$ and $V_{R7+2\Delta}$, respectively, until the entire codeword is digitally created. The logic-0 and logic-1 outputs from the RX threshold voltage bin identifier values of 0 and 31 can likewise be copied for corresponding outputs of the digitally created codeword. The read voltage optimization module 113 can then digitally create a second one of the remaining codewords. In the example of FIG. 7, the second of the remaining codewords is formed from the combination of the read strobe voltages $V_{R3-\Delta}$ and $V_{R7+\Delta}$. Therefore, the read voltage optimization module 113 can copy output bits from the codewords of the read operations associated with the combinations of the read strobe voltages $V_{R3-\Delta}$ and $V_{R7-\Delta}$ and the read strobe voltages $V_{R3+\Delta}$ and $V_{R7+\Delta}$, respectively, until the entire codeword is digitally created. The read voltage optimization module 113 can thus digitally create the second set of codewords representative of all remaining combinations of the read strobe voltages (e.g., twenty digitally created codewords in this example).

Figure 8:
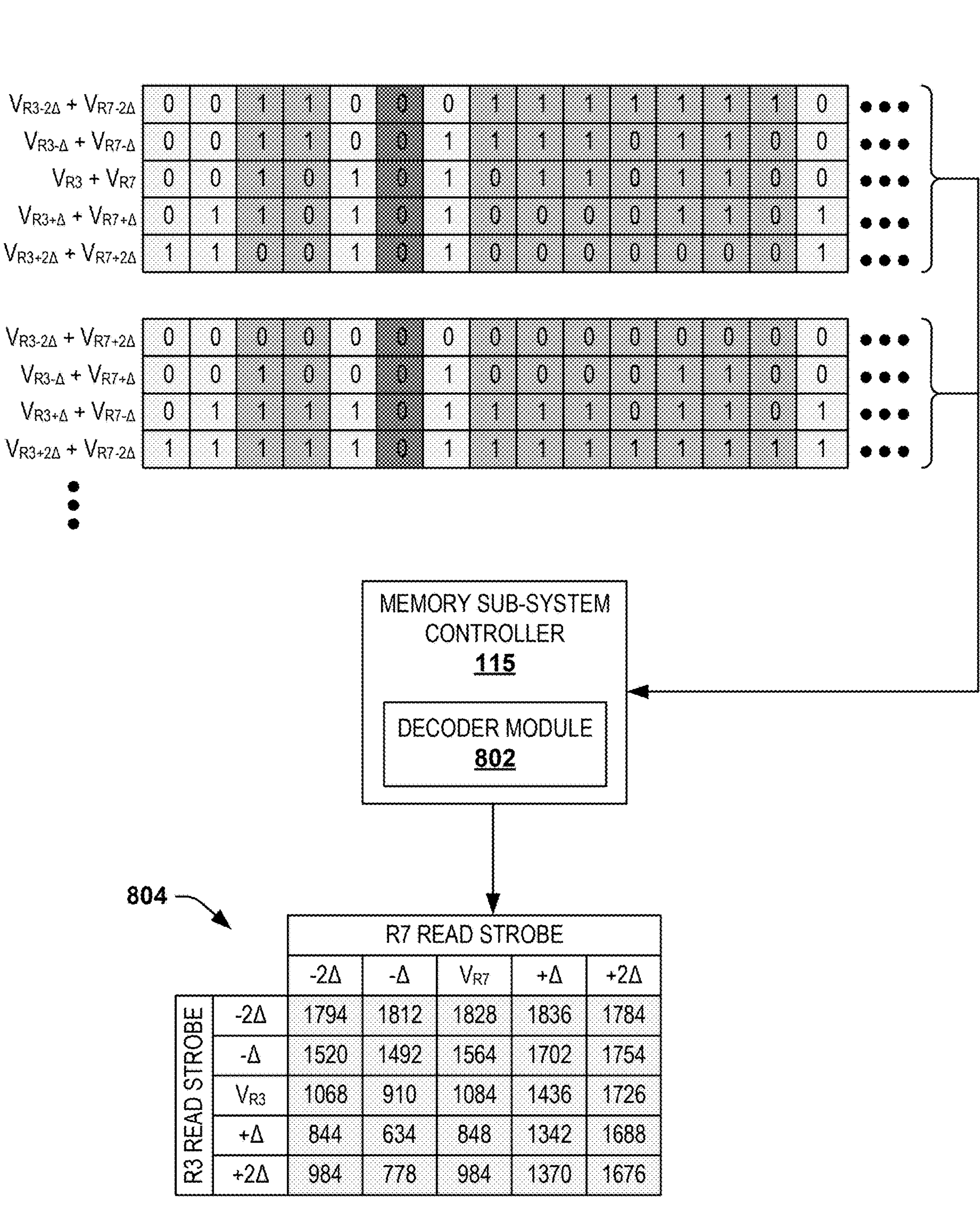
FIG. 8 illustrates an example diagram of determining syndrome weights of the codewords.

FIG. 8 illustrates an example diagram 800 of determining syndrome weights of the codewords. In the example of FIG. 8, each of the codewords that is generated by the read operations 706 and each of the digitally created codewords 710 of the different read strobe combinations can be provided to a decoder module 802 that is part of the memory sub-system controller 115. As an example, the decoder module 802 can be configured to implement any of a variety of decoding algorithms, such as LDPC decoding. Therefore, the decoder module 802 can determine a parity violation count that can correspond to a syndrome weight for each of the codewords. The parity violation count can correspond to an estimate of a fail bit count, and thus an estimate of the number of bit errors of the respective codewords.

The parity violation counts are demonstrated in a matrix at 804. The matrix 804 demonstrates each parity violation count as a result of the codewords having each of the combinations of the read strobe voltages $V_{R3-2\Delta}$, $V_{R3-\Delta}$, $V_{R3}$, $V_{R3+\Delta}$, and $V_{R3+2\Delta}$ and $V_{R7-2\Delta}$, $V_{R7-\Delta}$, $V_{R7}$, $V_{R7+\Delta}$, and $V_{R7+2\Delta}$. Therefore, the matrix 804 can identify the syndrome weight for each of the twenty-five codewords as a function of the combination of each possible pair of read strobe voltages. While the matrix 804 has twenty-five syndrome weights associated with the twenty-five different codewords, the matrix 804 can be significantly larger, such as having three dimensions. For example, the 5×5 matrix 804 can be applicable to the extra page read demonstrated in the example of FIG. 7, or similarly to a lower page read that likewise has two binary transitions between voltage levels. However, a matrix can be generated much larger in to accommodate more syndrome weights from more respective codewords, such as a three-dimensional matrix to accommodate 125 codewords (5 from read operations and 120 digitally created) for an upper page read.

Figure 9:
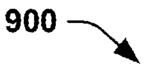
FIG. 9 illustrates an example diagram of optimizing read voltages.
Figure 9:
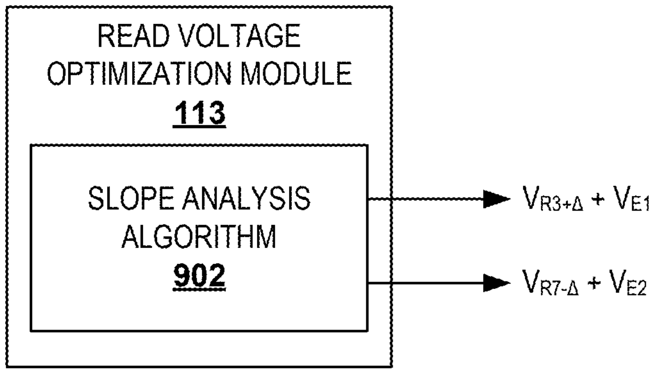

As described above, the read voltage optimization module 113 can optimize the read voltage based on the syndrome weights provided by the decoding process of the decoder module 802. FIG. 9 illustrates an example diagram 900 of optimizing read voltages. The diagram 900 includes the matrix 804 that was generated by the read voltage optimization module 113 in response to the decoding process of the decoder module 802. To optimize the read voltage, the read voltage optimization module 113 can identify which of the syndrome weights has the lowest value, and can optimize the read voltage based on the lowest value syndrome weight.

As described above, the optimization of the read voltage can be provided in a variety of circumstances. As one example, the read voltage optimization algorithm can be implemented as a result of excessive bit errors in a decoding process from a data read operation of the respective row of memory cells 104. As another example, the read voltage optimization algorithm can be implemented periodically in a background operating process to ensure accurate results from future data read operations. Other examples of operational conditions may require read voltage optimization. The purpose for implementing the read voltage optimization algorithm can dictate a desired precision of the read voltage optimization.

As an example, the read voltage optimization module 113 can implement a coarse resolution optimization of the read voltage. In such an example, the read voltage optimization module 113 can be commanded to implement the read voltage optimization algorithm as a result of excessive bit errors in a decoding process from a data read operation of the respective row of memory cells 104. In such an example, the read voltage optimization does not need to be very precise, but only precise enough to mitigate bit errors to a level that allows the memory sub-system controller 115 to implement sufficient error-correction to decode the associated codeword that is read from the row of memory cells 104.

Therefore, in such a coarse resolution of read voltage optimization, the read voltage optimization module 113 can identify in the matrix 804 the lowest value of the syndrome weights. In the example of FIG. 8, the lowest value of the syndrome weights is demonstrated as 634 that results from the codeword having the combination of read strobe voltages $V_{R3+\Delta}$ and $V_{R7-\Delta}$. Accordingly, the read voltage optimization module 113 can merely set the optimized read voltage to the read strobe voltages $V_{R3+\Delta}$ and $V_{R7-\Delta}$. Therefore, the memory sub-system controller 115 can perform data read operations thereafter on the row of memory cells 104 using the read strobe voltages $V_{R3+\Delta}$ and $V_{R7-\Delta}$ as the read voltages.

As described above, the read voltage optimization algorithm can be implemented to provide a higher precision for the optimized read voltage, such as based on read voltage optimization algorithm being implemented in a background process or for any of a variety of other reasons (e.g., a subsequent decoding failure from the coarse resolution optimization described above). For a higher precision or fine resolution read voltage optimization, the read voltage optimization module 113 can implement the lowest value syndrome weight as a starting point for further optimization.

As an example, upon identifying the lowest syndrome weight in the matrix 804, the read voltage optimization module 113 can interpolate the optimized read voltage based on syndrome weights of codewords associated with read strobe voltages that are proximal to the read strobe voltages of the lowest syndrome weight. In the example of FIG. 9, the read voltage optimization module 113 can identify the lowest value syndrome weights of the orthogonally adjacent combinations of read strobe voltages to determine a more optimal read strobe voltage amplitude for each of the read strobes (R3 and R7).

For the determination of the optimal amplitude of the R3 read strobe voltage, the read voltage optimization module 113 can identify that the read strobe voltages $V_{R3+2\Delta}$ and $V_{R7-\Delta}$ has a lower syndrome weight than the read strobe voltages $V_{R3}$ and $V_{R7-\Delta}$. Therefore, the read voltage optimization module 113 can interpolate the optimal amplitude for the R3 read strobe voltage as being between the amplitudes $V_{R3+\Delta}$ and $V_{R3+2\Delta}$. Similarly, for the determination of the optimal amplitude of the R7 read strobe voltage, the read voltage optimization module 113 can identify that the read strobe voltages $V_{R3+\Delta}$ and $V_{R7-2\Delta}$ has a (marginally) lower syndrome weight than the read strobe voltages $V_{R3+\Delta}$ and $V_{R7}$. Therefore, the read voltage optimization module 113 can interpolate the optimal amplitude for the R7 read strobe voltage as being between the amplitudes $V_{R7+\Delta}$ and $V_{R7}$.

For example, the read voltage optimization module 113 can include a slope analysis algorithm 902 that is configured to interpolate the optimal read strobe voltages based on the slopes corresponding to the difference between the syndrome weights of orthogonally adjacent combinations of the read strobe voltages in the matrix 804. The slope analysis algorithm 902 can correspond to any of a variety of algorithms that can analyze one or more slopes of differences between syndrome weights to interpolate an optimal syndrome weight value between two specific syndrome weights. The slope analysis algorithm 902 can thus determine a more granular optimized read strobe voltage for each of the read strobes R3 and R7. In the example of FIG. 9, the granular read strobe voltages are demonstrated as an optimized read strobe voltage $V_{R3+\Delta}+V_{E1}$, which has an amplitude between read strobe voltages $V_{R3+\Delta}$ and $V_{R3+2\Delta}$, and an optimized read strobe voltage $V_{R7-\Delta}+V_{E2}$, which has an amplitude between read strobe voltages $V_{R7-\Delta}$ and $V_{R7-2\Delta}$. The optimized read strobe voltages determined by the slope analysis algorithm 902 can thus either be saved in a buffer for future data read operations, or can be implemented in a subsequent data read operation (e.g., after failure of a codeword to decode as a result of excessive errors). Accordingly, the read voltage optimization module 113 can optimize the read strobe voltages based on the syndrome weights in a variety of ways.

Figure 10:
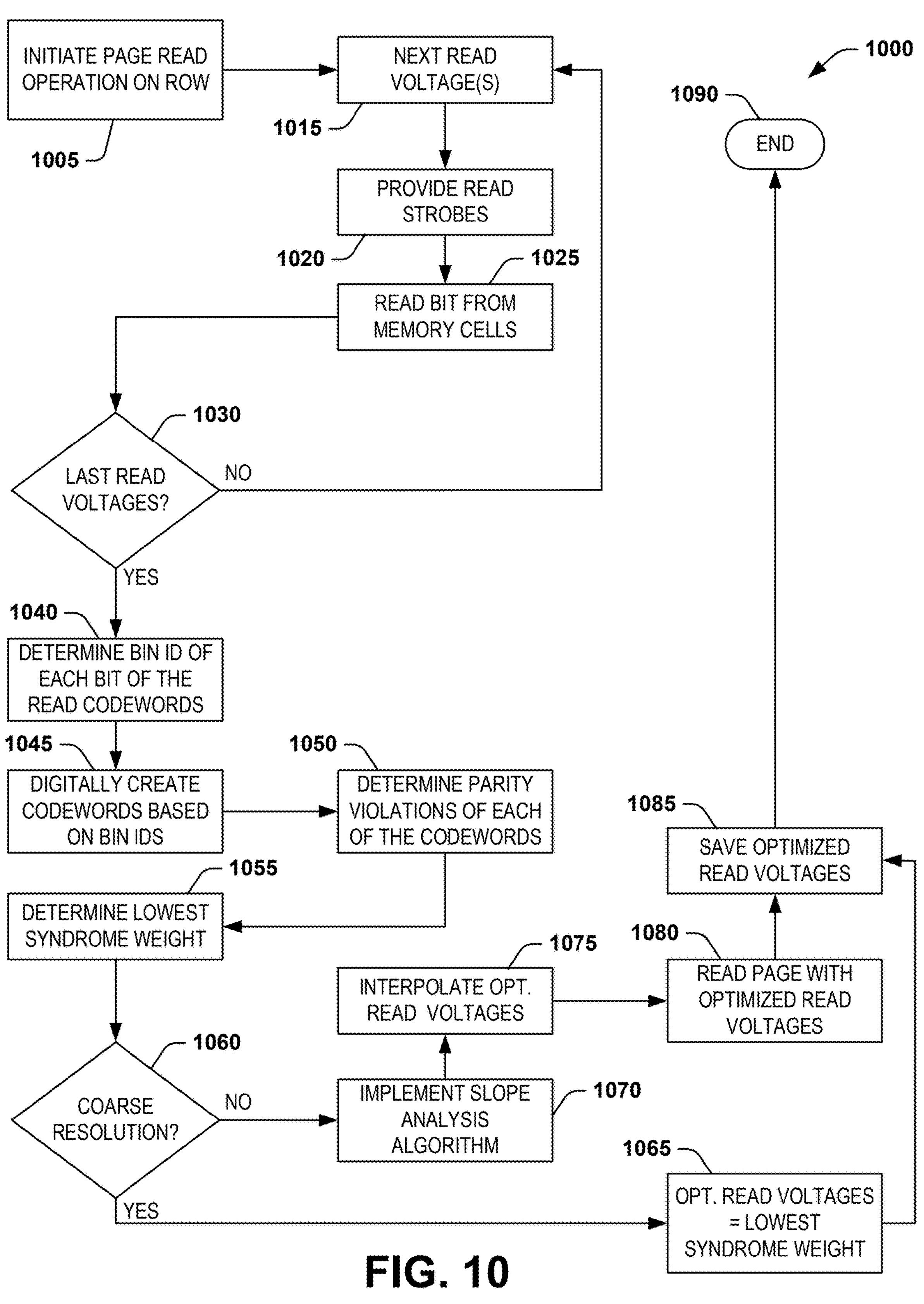
FIG. 10 illustrates an example flow diagram of optimizing read voltages.

FIG. 10 illustrates a flow diagram of a method 1000 of optimizing a read voltage based on syndrome weights. The method 1000 can be implemented, for example, by a controller, such as the memory sub-system controller 115 (e.g., the read voltage optimization module 113) of the system 100 of FIG. 1A. The method 1000 can thus correspond to the read voltage optimization algorithm described herein. In the example of FIG. 10, the method 1000 describes optimization of a read voltage, which could be multiple read strobe voltages that are provided in a single read operation for a multi-level memory cell 104. The method begins at block 1005, in which the controller initiates a page read operation of a row of memory cells 104. For example, the pages can include a lower page, an upper page, and an extra page, as demonstrated in the examples of FIG. 3B and FIGS. 4A through 4C. The method then proceeds to block 1015.

At 1015, one or more next read voltages are selected. As an example, the read voltage(s) can correspond to two read strobe voltages (or three read strobe voltages for an upper page read) of respective sets of read strobe voltages. For example, as described above, the first read operation of the memory cell can implement read strobe voltages $V_{R3-2\Delta}$ and $V_{R7-2\Delta}$, as described above in the examples of FIGS. 5 and 7, such that the read strobe voltages $V_{R3-2\Delta}$ and $V_{R7-2\Delta}$ are selected at 1015. The method 1000 then proceeds to 1020, at which the read strobe voltages (e.g., read strobe voltages $V_{R3-2\Delta}$ and $V_{R7-2\Delta}$) are provided to the memory cells in the row. The method 1000 then proceeds to 1025, at which an output bit is read from each of the memory cells. The providing of the read strobe voltages at 1020 and the reading of the output bits in response at 1025 can thus correspond to a single page read operation. The output bit for each memory cell can be single output bit that is provided as an aggregation of the outputs provided from the separate read strobe voltages (e.g., based on a logic-XNOR operation). The method 1000 then proceeds to 1030.

At 1030, a determination is made as to whether the read voltages selected at 1015 are the last read voltages. If the determination at 1030 is negative (e.g., NO), the method 1000 proceeds back to 1015, at which the next read voltages (e.g., read strobe voltages) are selected for the next read operation. If the determination at 1030 is positive (e.g., YES), then the method 1000 proceeds to 1040.

At 1040, the method 1000 determines the threshold voltage bin identifier ("BIN ID") of each output bit of the codeword read from the row of memory cells. The threshold voltage bin identifier values can be unique binary codes for threshold voltages that are proximal to the nominal read strobe voltages (e.g., $V_{R3}$ and $V_{R7}$), or can be a 0 or 31 for all other threshold voltages that are irrelevant for optimization purposes. The codewords for which the threshold voltage bin identifier values are determined at 1040 can correspond to a first set of codewords that result from the actual read operations. The method 1000 then proceeds to 1045. At 1045, a second set of codewords corresponding to the remaining codewords of all remaining possible combinations of read strobe voltages is digitally created. The digital creation of the second set of codewords can be based on the output values from the first set of codewords of a common one of the read strobe voltages and based on the common read strobe, as identified by the threshold voltage bin identifier of the output bit. The method 1000 then proceeds to 1050.

At 1050, parity violations of each of the codewords (e.g., first and second sets of codewords) are determined. The read voltage optimization module 113 can provide each of the codewords to the decoder module 802 to determine the parity violations, and thus the syndrome weight, of each of the codewords. The method 1000 then proceeds to 1055. At 1055, the lowest syndrome weight of all of the syndrome weights of the codewords is determined. The read voltage optimization module 113 can thus implement the lowest syndrome weight as the starting point for determining the optimal read voltage (e.g., optimal read strobe voltages). The method 1000 then proceeds to 1060.

At 1060, a determination is made as to whether the optimization of the read voltage is a coarse resolution. If the determination at 1060 is positive (e.g., YES), the method 1000 proceeds to 1065, at which the read voltage optimization module 113 determines that the optimized read voltages are equal to the read voltages that correspond to the lowest syndrome weight. For example, the optimized read voltages can correspond to the combination of read strobe voltages that resulted in the codeword having the lowest syndrome weight. The method 1000 then proceeds to 1085. If the determination at 1060 is negative (e.g., NO), then the method 1000 proceeds to 1070.

At 1070, the read voltage optimization module 113 implements a slope analysis algorithm on the syndrome weights. As an example, the slope analysis algorithm can identify orthogonally adjacent syndrome weights in a matrix corresponding to different combinations of the read strobe voltages, and can analyze the slopes of the differences therein. The method 1000 then proceeds to 1075, at which the read voltage optimization module 113 interpolates the optimized read voltages based on the slope analysis. The optimized read voltages can thus have amplitudes that are between different combinations of the read strobe voltages. The method 1000 then proceeds to 1080.

At 1080, a read operation is performed on the page of the memory row with the optimized read voltages. The method step 1080 can be applicable if the optimization of the read voltages is implemented in response to a failure to sufficiently correct errors of a codeword read from the page, such that the optimization of the read voltages is intended to mitigate errors resulting from threshold voltage drift for a given read operation. Therefore, the read operation at 1080 can be omitted, such as if the read voltage optimization is performed as a background process for future read operations. The method 1000 then proceeds to 1085.

At 1085, the optimized read voltages are saved (e.g., in a buffer) for future read operations. The method step 1085 can be applicable if the optimization of the read voltages is implemented as a background process for future read operations. Therefore, the saving of the optimized read voltages at 1085 can be omitted, such as if the read voltage optimization is performed in response to a failure to sufficiently correct errors of a codeword read from the page. In such an example, the optimized read voltages may no longer be necessary after the codeword is read from the page of the row of memory cells. The method 1000 then proceeds to 1090, at which the method 1000 ends.

Figure 11:
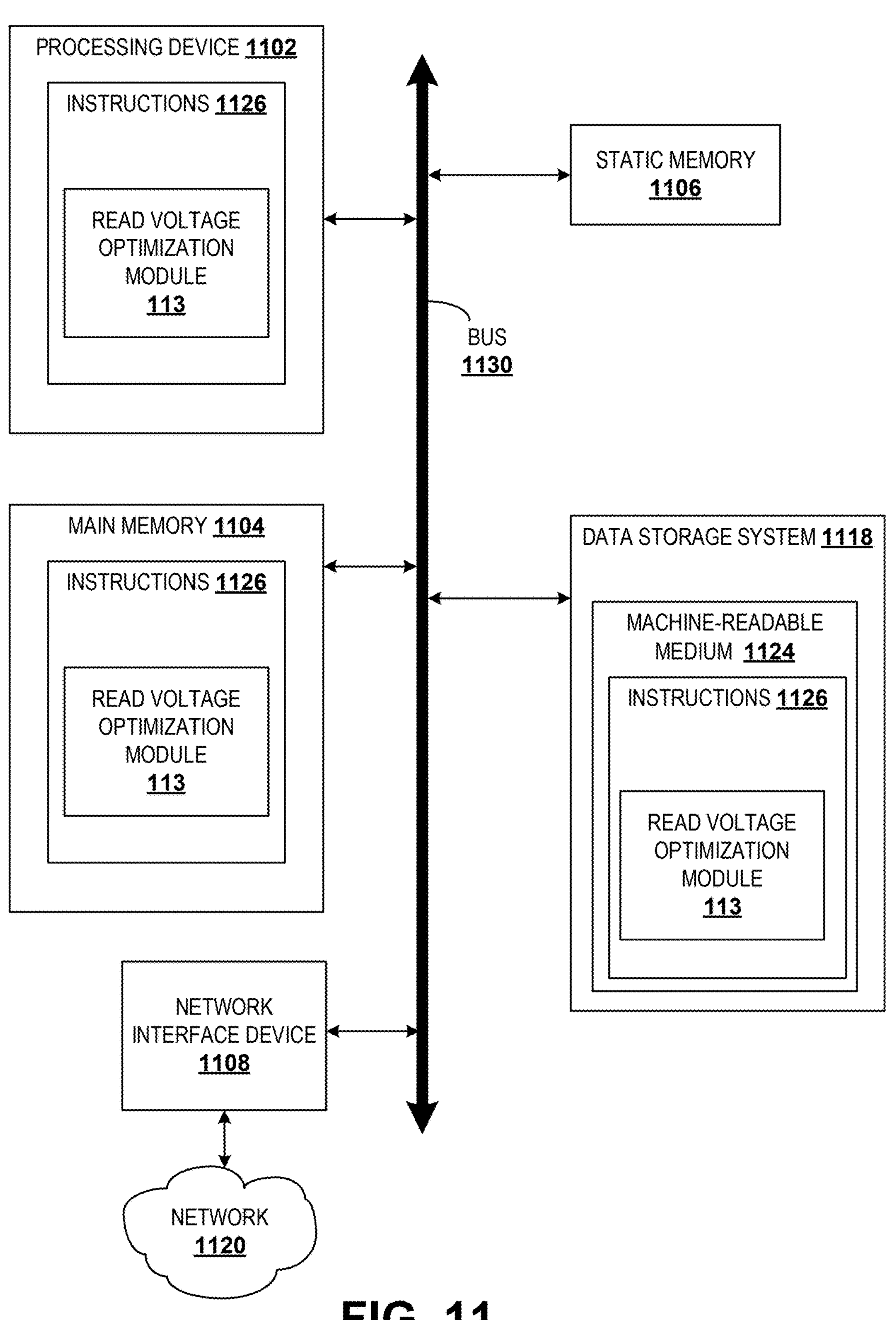
FIG. 11 illustrates an example of a computer system in which examples of the present description may operate.

FIG. 11 illustrates an example machine of a computer system 1100 (a machine) within which a set of instructions, for causing the machine to perform any one or more of the methodologies discussed herein, can be executed. In some examples, the computer system 1100 corresponds to a host system (e.g., the host system 120 of FIG. 1A) that includes, is coupled to, or utilizes a memory sub-system (e.g., the memory sub-system 110 of FIG. 1A) or is used to perform the operations of a controller (e.g., to execute an operating system to perform operations corresponding to the read voltage optimization module 113 of FIG. 1A). In other examples, the machine is connected (e.g., networked) to other machines in a LAN, an intranet, an extranet and/or the Internet. In various examples, the machine operates in the capacity of a server or a client machine in client-server network environment, as a peer machine in a peer-to-peer (or distributed) network environment or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge or any machine capable of executing a set of instructions (sequential or otherwise) that specify actions to be taken by that machine. In other examples, the machine may be a computer within an automotive application, a data center, a smart factory, or other industrial application. Further, while a single machine is illustrated, the term "machine" shall also be taken to include any collection of machines that individually or jointly execute a set (or multiple sets) of instructions to perform the methodologies discussed herein.

The example computer system 1100 includes a processing device 1102, a main memory 1104 (e.g., read-only memory (ROM), flash memory, dynamic random access memory (DRAM) such as synchronous DRAM (SDRAM) or Rambus DRAM (RDRAM), etc.), a static memory 1106 (e.g., flash memory, static random access memory (SRAM) or other non-transitory computer-readable media) and a data storage system 1118, which communicate with each other via a bus 1130.

The processing device 1102 represents one or more general-purpose processing devices such as a microprocessor, a central processing unit, etc. More particularly, the processing device 1102 can be a complex instruction set computing (CISC) microprocessor, reduced instruction set computing (RISC) microprocessor, very long instruction word (VLIW) microprocessor or a processor implementing other instruction sets or processors implementing a combination of instruction sets. In some examples, the processing device 1102 is implemented with a special-purpose processing devices such as an application specific integrated circuit (ASIC), a field programmable gate array (FPGA), a digital signal processor (DSP), network processor, etc. The processing device 1102 is configured to execute instructions 1126 for performing the operations discussed herein. In some examples, the computer system 1100 includes a network interface device 1108 to communicate over the network 1120.

The data storage system 1118 includes a machine-readable storage medium 1124 (also known as a computer-readable medium) that store sets of instructions 1126 or software for executing the methodologies and/or functions described herein. The machine-readable storage medium 1124 is a non-transitory medium. The instructions 1126 can also reside, completely or at least partially, within the main memory 1104 and/or within the processing device 1102 during execution thereof by the computer system 1100, the main memory 1104 and the processing device 1102 also constituting machine-readable storage media. The machine-readable storage medium 1124, data storage system 1118 and/or main memory 1104 can correspond to the memory sub-system 110 of FIG. 1A. Accordingly, the machine-readable storage medium 1124, the data storage system 1118 and/or the main memory 1104 are examples of non-transitory computer-readable media.

In some examples, the instructions 1126 include instructions to implement functionality corresponding to the read voltage optimization module 113 of FIG. 1A. As an example, the instructions can include providing multiple read voltages for each of a set of read operations to determine respective outputs from the memory cells, generating codewords associated with different combinations of the read voltages, and providing the codewords to a decoder module to determine syndrome weights. The read voltage optimization module 113 can thus determine the optimized read voltage based on the lowest determined syndrome weight of the codewords. While the machine-readable storage medium 1124 is shown in an example to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared and otherwise manipulated. It has proven convenient at times, principally for reasons of common usage, to refer to these signals as bits, values, elements, symbols, characters, terms, numbers, etc.

It is noted, however, that all of these and similar terms are to be associated with the appropriate physical quantities and are merely convenient labels applied to these quantities. This description can refer to the action and processes of a computer system or similar electronic computing device that manipulates and transforms data represented as physical (electronic) quantities within the computer system's registers and memories into other data similarly represented as physical quantities within the computer system memories or registers or other such information storage systems.

This description also relates to an apparatus for performing the operations herein. This apparatus can be specially constructed for the intended purposes or this apparatus can include a general purpose computer selectively activated or reconfigured by a computer program stored in the computer. Such a computer program can be stored in a computer readable storage medium, such as, but not limited to, any type of disk including floppy disks, optical disks, CD-ROMs, magnetic-optical disks, read-only memories (ROMs), random access memories (RAMs), EPROMs, EEPROMs, magnetic or optical cards or any type of media suitable for storing electronic instructions, each coupled to a computer system bus.

The algorithms and displays presented herein are not inherently related to any particular computer or other apparatus. Various general purpose systems can be used with programs in accordance with the descriptions herein, or it can prove convenient to construct a more specialized apparatus to perform the method. In addition, the present disclosure is not described with reference to any particular programming language. It will be appreciated that a variety of programming languages can be used to implement the teachings of the disclosure as described herein.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications and variations that fall within the scope of this application, including the appended claims. As used herein, the term "includes" means includes but not limited to, the term "including" means including but not limited to. The term "based on" means "based at least in part on". Additionally, where the disclosure or claims recite "a," "an," "a first" or "another" element, or the equivalent thereof, it should be interpreted to include one or more than one such element, neither requiring nor excluding two or more such elements.

What is claimed is:

1. A method for determining an optimal read voltage for reading a set of memory cells, the method comprising:

providing a plurality of read voltages having different amplitudes via a controller to each of the memory cells;

reading an output of each of the memory cells via the controller in response to each of the read voltages of the plurality of voltages;

determining an approximate amplitude of a threshold voltage of each of the memory cells via the controller based on the output of each of the respective memory cells in response to each of the read voltages to generate a plurality of codewords, each of the codewords being associated with a respective one of the read voltages;

implementing a decoding process on each of the codewords via the controller to determine a syndrome weight of each of the codewords; and determining the optimal read voltage via the controller based on one of the codewords associated with a respective one or more of the read voltages having a lowest value of the syndrome weight.

2. The method of claim 1, wherein each of the memory cells is arranged as a multi-level memory cell, wherein providing the read voltages comprises providing each of the read voltages as a combination of a first read strobe voltage and a second read strobe voltage, wherein reading the output of each of the memory cells comprises reading the output of each of the memory cells in response to providing each combination of the first and second read strobe voltages to each of the memory cells; and wherein determining the optimal read voltage comprises determining a first optimal read strobe voltage and a second optimal read strobe voltage based on the combination of the first and second read strobe voltages having the lowest value of the syndrome weight.

3. The method of claim 2, wherein the first read strobe voltage is selected from a first predefined set of read strobe voltages comprising a first nominal read strobe voltage and a plurality of first offset read strobe voltages each having a predefined amplitude that is offset from the first nominal read strobe voltage, wherein the second read strobe voltage is selected from a second predefined set of read strobe voltages comprising a second nominal read strobe voltage and a plurality of second offset read strobe voltages each having a predefined amplitude that is offset from the second nominal read strobe voltage.

4. The method of claim 3, wherein providing the read voltages as the combination of the first and second read strobe voltages comprises:

providing each combination of the first and second read strobe voltages as including one of the first predefined set of read strobe voltages and one of the second predefined set of read strobe voltages; and providing a set of unique combinations of the first and second read strobe voltages having a quantity that is less than a total quantity of all unique combinations of the first and second read strobe voltages to each of the memory cells.

5. The method of claim 4, wherein determining the approximate amplitude of the threshold voltage of each of the memory cells comprises determining the approximate amplitude of the threshold voltage of each of the memory cells based on the output of each of the respective memory cells in response to each combination of the first and second read strobe voltages to generate the codewords as a first plurality of codewords, each of the first codewords being associated with a respective one of the set of unique combinations of the first and second read strobe voltages.

6. The method of claim 5, wherein determining the approximate amplitude of the threshold voltage of each of the memory cells further comprises determining a threshold voltage bin identifier for the threshold voltage of each of the memory cells, the threshold voltage bin identifier corresponding to one of a plurality of unique binary codes that are each associated with a separate range of voltage amplitudes between each consecutive one of the first predefined set of read strobe voltages and between each consecutive one of the second predefined set of read strobe voltages.

7. The method of claim 5, wherein the set of unique combinations of the first and second read strobe voltages is a first set of unique combinations of the first and second read strobe voltages, the method further comprising digitally creating a second plurality of codewords based on providing the output of each of the memory cells from two of the first codewords to generate each of the second codewords, each of the second codewords being associated with a respective one of a second set of unique combinations of the first and second read strobe voltages, the first and second sets of unique combinations having a summed quantity that is equal to the total quantity of all unique combinations of the first and second sets of read strobe voltages.

8. The method of claim 7, wherein implementing the decoding process comprises implementing the decoding process on each of the first and second codewords to determine the syndrome weight of each of the first and second codewords, wherein determining the optimal read voltage comprises determining the optimal first and second read strobe voltages based on one of the first and second codewords associated with a respective combination of the first and second read strobe voltages having the lowest value of the syndrome weight.

9. The method of claim 8, further comprising setting the optimal first and second read strobe voltages equal to the respective combination of the first and second read strobe voltages associated with the respective one of the first and second codewords having the lowest value of the syndrome weight.

10. The method of claim 8, wherein implementing the decoding process comprises implementing the decoding process on each of the first and second codewords to determine the syndrome weight of each of the first and second codewords in an array of the first predefined set of read strobe voltages relative to the second predefined set of read strobe voltages, wherein determining the optimal read voltage comprises:

determining a first location in the array corresponding to the lowest value of the syndrome weight;

determining a second location in the array that is adjacent to the first location and has a next lowest value of the syndrome weight; and implementing a slope analysis algorithm to interpolate one of the optimal first and second read strobe voltages between the syndrome weight associated with each of the first and second locations in the array.

11. A system for determining an optimal read voltage for reading a set of memory cells of a memory device, comprising:

the memory device; and a processing device coupled to the memory device, the processing device to perform operations comprising:

providing a plurality of read voltages having different amplitudes to each of the memory cells;

reading an output of each of the memory cells in response to each of the read voltages of the plurality of voltages;

determining an approximate amplitude of a threshold voltage of each of the memory cells based on the output of each of the respective memory cells in response to each of the read voltages to generate a plurality of codewords, each of the codewords being associated with a respective one of the read voltages;

implementing a decoding process on each of the codewords to determine a syndrome weight of each of the codewords; and determining the optimal read voltage based on one of the codewords associated with a respective one or more of the read voltages having a lowest value of the syndrome weight.

12. The system of claim 11, wherein each of the memory cells is arranged as a multi-level memory cell, wherein providing the read voltages comprises providing each of the read voltages as a combination of a first read strobe voltage and a second read strobe voltage, wherein reading the output of each of the memory cells comprises reading the output of each of the memory cells in response to providing each combination of the first and second read strobe voltages to each of the memory cells; and wherein determining the optimal read voltage comprises determining a first optimal read strobe voltage and a second optimal read strobe voltage based on the combination of the first and second read strobe voltages having the lowest value of the syndrome weight.

13. The system of claim 12, wherein the first read strobe voltage is selected from a first predefined set of read strobe voltages comprising a first nominal read strobe voltage and a plurality of first offset read strobe voltages each having a predefined amplitude that is offset from the first nominal read strobe voltage, wherein the second read strobe voltage is selected from a second predefined set of read strobe voltages comprising a second nominal read strobe voltage and a plurality of second offset read strobe voltages each having a predefined amplitude that is offset from the second nominal read strobe voltage.

14. The system of claim 13, wherein providing the read voltages as the combination of the first and second read strobe voltages comprises:

providing each combination of the first and second read strobe voltages as including one of the first predefined set of read strobe voltages and one of the second predefined set of read strobe voltages; and providing a set of unique combinations of the first and second read strobe voltages having a quantity that is less than a total quantity of all unique combinations of the first and second read strobe voltages to each of the memory cells.

15. The system of claim 14, wherein determining the approximate amplitude of the threshold voltage of each of the memory cells comprises determining the approximate amplitude of the threshold voltage of each of the memory cells based on the output of each of the respective memory cells in response to each combination of the first and second read strobe voltages to generate the codewords as a first plurality of codewords, each of the first codewords being associated with a respective one of the set of unique combinations of the first and second read strobe voltages.

16. A non-transitory computer-readable storage medium comprising instructions that, when executed by a processing device, cause the processing device to determine an optimal read voltage for reading a set of memory cells, wherein determining the optimal read voltage comprising:

providing a plurality of read voltages having different amplitudes to each of the memory cells;

reading an output of each of the memory cells in response to each of the read voltages of the plurality of voltages;

determining an approximate amplitude of a threshold voltage of each of the memory cells based on the output of each of the respective memory cells in response to each of the read voltages to generate a plurality of codewords, each of the codewords being associated with a respective one of the read voltages;

implementing a decoding process on each of the codewords to determine a syndrome weight of each of the codewords; and determining the optimal read voltage based on one of the codewords associated with a respective one or more of the read voltages having a lowest value of the syndrome weight.

17. The medium of claim 16, wherein each of the memory cells is arranged as a multi-level memory cell, wherein providing the read voltages comprises providing each of the read voltages as a combination of a first read strobe voltage and a second read strobe voltage, wherein reading the output of each of the memory cells comprises reading the output of each of the memory cells in response to providing each combination of the first and second read strobe voltages to each of the memory cells; and wherein determining the optimal read voltage comprises determining a first optimal read strobe voltage and a second optimal read strobe voltage based on the combination of the first and second read strobe voltages having the lowest value of the syndrome weight.

18. The medium of claim 17, wherein the first read strobe voltage is selected from a first predefined set of read strobe voltages comprising a first nominal read strobe voltage and a plurality of first offset read strobe voltages each having a predefined amplitude that is offset from the first nominal read strobe voltage, wherein the second read strobe voltage is selected from a second predefined set of read strobe voltages comprising a second nominal read strobe voltage and a plurality of second offset read strobe voltages each having a predefined amplitude that is offset from the second nominal read strobe voltage.

19. The medium of claim 18, wherein providing the read voltages as the combination of the first and second read strobe voltages comprises:

providing each combination of the first and second read strobe voltages as including one of the first predefined set of read strobe voltages and one of the second predefined set of read strobe voltages; and providing a set of unique combinations of the first and second read strobe voltages having a quantity that is less than a total quantity of all unique combinations of the first and second read strobe voltages to each of the memory cells.

20. The medium of claim 19, wherein determining the approximate amplitude of the threshold voltage of each of the memory cells comprises determining the approximate amplitude of the threshold voltage of each of the memory cells based on the output of each of the respective memory cells in response to each combination of the first and second read strobe voltages to generate the codewords as a first plurality of codewords, each of the first codewords being associated with a respective one of the set of unique combinations of the first and second read strobe voltages.

* * * * *